United States Patent
Krymski

(10) Patent No.: US 11,011,560 B2
(45) Date of Patent: May 18, 2021

(54) IMAGE SENSORS, METHODS, AND HIGH DYNAMIC RANGE PIXELS WITH VARIABLE CAPACITANCE

(71) Applicant: Alexander Krymski, Sunny Isles Beach, FL (US)

(72) Inventor: Alexander Krymski, Sunny Isles Beach, FL (US)

(73) Assignee: Alexander Krymski, Sunny Isles Beach, FL (US)

( * ) Notice: Subject to any disclaimer, the term of this patent is extended or adjusted under 35 U.S.C. 154(b) by 124 days.

(21) Appl. No.: 15/854,527

(22) Filed: Dec. 26, 2017

(65) Prior Publication Data

US 2019/0199947 A1    Jun. 27, 2019

(51) Int. Cl.
*H01L 27/146*    (2006.01)

(52) U.S. Cl.
CPC .... *H01L 27/14616* (2013.01); *H01L 27/1461* (2013.01); *H01L 27/14614* (2013.01); *H01L 27/14643* (2013.01)

(58) Field of Classification Search
CPC ..... H04N 5/374–37457; H04N 5/3559; H04N 5/335–378; H04N 5/35518; H04N 5/355; H04N 5/35527; H01L 27/14643–14663; H01L 27/146–14698; G01R 31/2639; G01R 31/2641
See application file for complete search history.

(56) References Cited

U.S. PATENT DOCUMENTS

| | | |
|---|---|---|
| 7,205,522 B2 | 4/2007 | Krymski |
| 7,334,211 B1 * | 2/2008 | Toros ................ G06F 17/5009 257/E27.131 |
| 7,336,214 B2 | 2/2008 | Krymski |
| 7,361,877 B2 | 4/2008 | McGrath et al. |
| 7,400,279 B2 | 7/2008 | Krymski |
| 7,488,928 B2 | 2/2009 | Krymski |
| 7,659,925 B2 | 2/2010 | Krymski |
| 7,804,438 B2 | 9/2010 | Krymski |
| 7,829,969 B2 | 11/2010 | Altice et al. |
| 7,876,362 B2 | 1/2011 | Krymski |
| 8,174,603 B2 | 5/2012 | Krymski |
| 8,310,578 B2 | 11/2012 | Krymski |
| 8,698,061 B2 | 4/2014 | Krymski |
| 8,723,093 B2 | 5/2014 | Krymski |
| 8,785,831 B2 | 7/2014 | Krymski |

(Continued)

*Primary Examiner* — Paul M Berardesca
(74) *Attorney, Agent, or Firm* — Foley & Lardner LLP

(57) ABSTRACT

A pixel includes a photodiode and a readout node for receiving charge transferred from the photodiode. The readout node is configured to have a variable capacitance that is non-linear with respect to a voltage at the readout node. The readout node is resettable. The readout node may be configured to have a lower capacitance when reset to a reset voltage than when getting filled with charge from the photodiode. The readout node may be configured such that the capacitance of the readout node continuously increases as additional charge is received by the readout node after the readout node is reset. The readout node may be configured such that the capacitance of the readout node jumps from a first capacitance to a second capacitance after the readout node has been filled with a certain amount of charge. An image sensor includes a pixel array with a plurality of the pixels.

20 Claims, 19 Drawing Sheets

(56) References Cited

U.S. PATENT DOCUMENTS

| | | | |
|---|---|---|---|
| 9,019,411 B2 | 4/2015 | Krymski | |
| 9,363,456 B2 | 6/2016 | Krymski | |
| 9,369,648 B2 | 6/2016 | Hynecek et al. | |
| 9,578,267 B2 | 2/2017 | Slovick et al. | |
| 9,654,713 B2 | 5/2017 | Hynecek et al. | |
| 10,057,523 B1 | 8/2018 | Krymski | |
| 2005/0001277 A1* | 1/2005 | Rhodes | H01L 27/14603 257/431 |
| 2007/0257280 A1* | 11/2007 | Hynecek | H01L 27/14609 257/225 |
| 2012/0313197 A1* | 12/2012 | Chen | H01L 27/14616 257/431 |
| 2014/0103189 A1* | 4/2014 | Chen | H04N 5/3559 250/208.1 |
| 2015/0229859 A1* | 8/2015 | Guidash | H04N 5/35554 348/308 |
| 2017/0111603 A1* | 4/2017 | Hynecek | H04N 5/374 |

\* cited by examiner

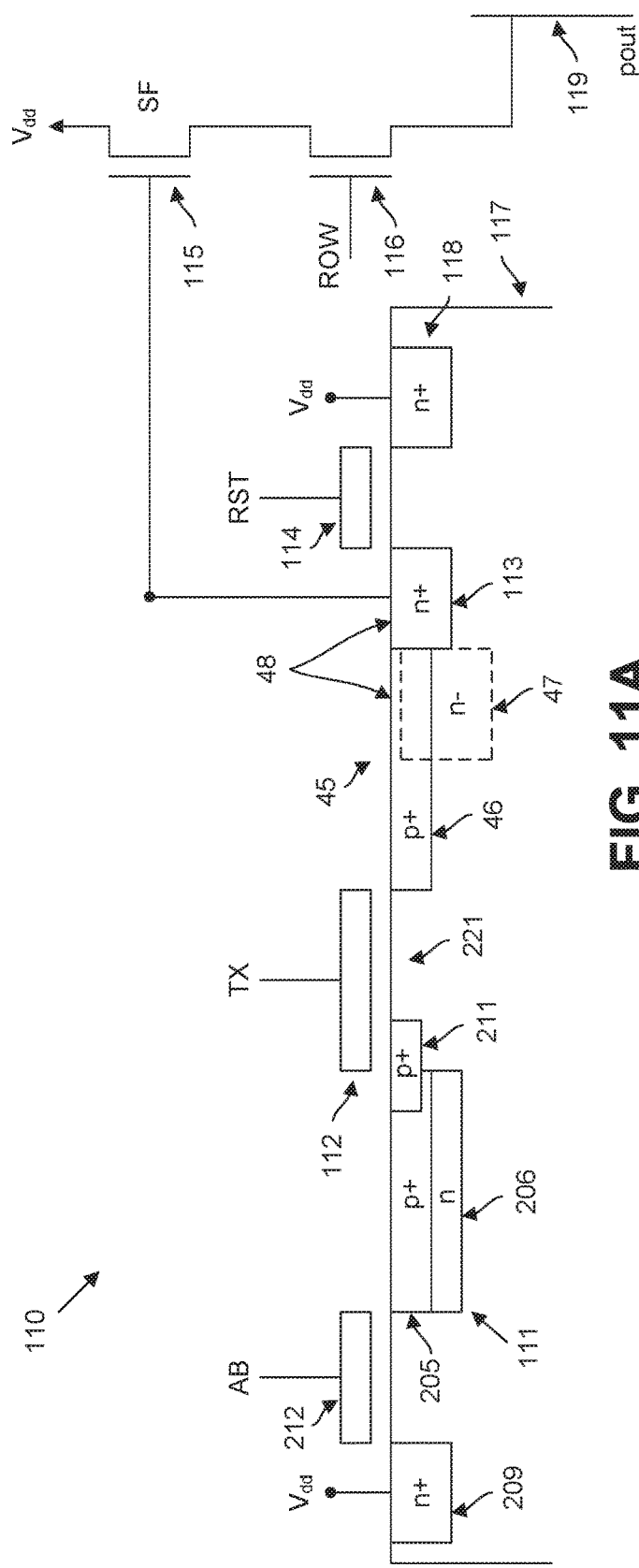
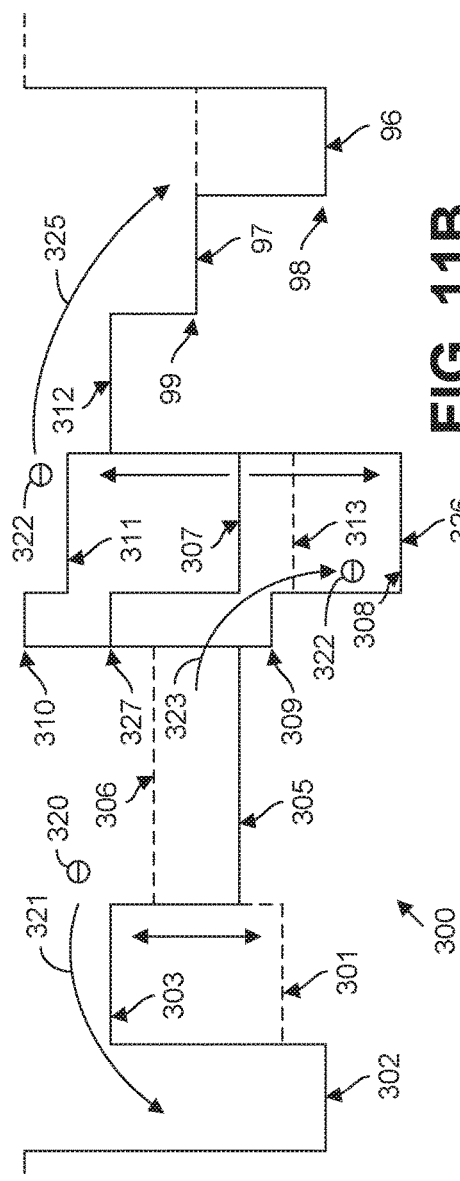
FIG. 11A
FIG. 11B

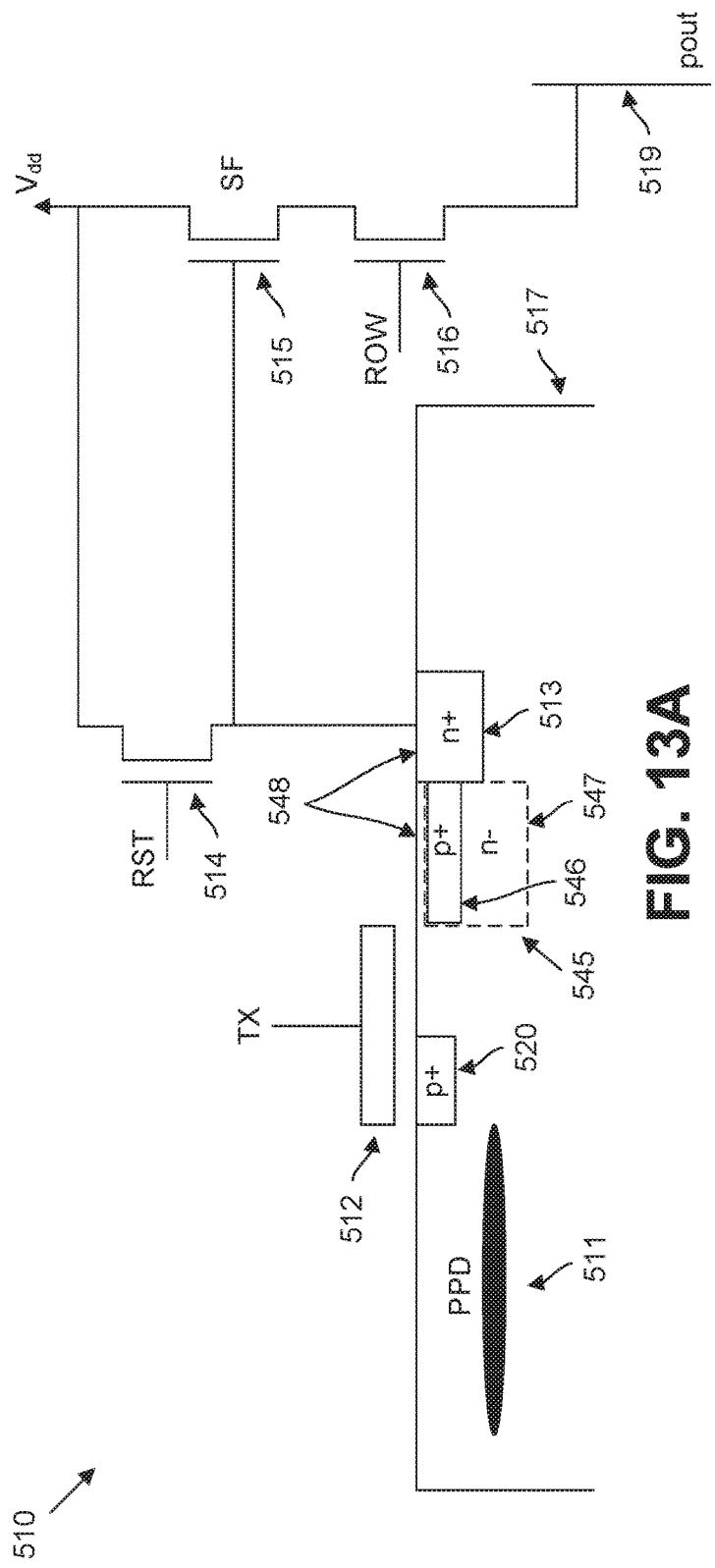
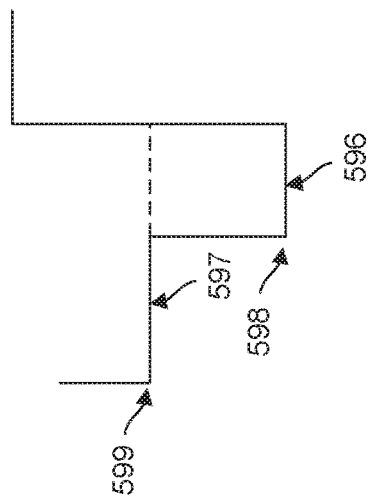
FIG. 13A
FIG. 13B

IMAGE SENSORS, METHODS, AND HIGH DYNAMIC RANGE PIXELS WITH VARIABLE CAPACITANCE

FIELD

Embodiments described herein relate generally to image sensors, pixels for image sensors, and methods for operating pixels of image sensors.

BACKGROUND

Image sensors have found wide application in consumer and industrial electronics, and have enabled an explosion in a number of digital cameras and digital video devices used for work and entertainment.

FIG. 1 illustrates an architecture of a related art image sensor 1. The image sensor 1 includes a pixel array 2, a row driver 4, column readout circuitry 7, and a column circuit timing controller 9. The pixel array 2 includes pixels 3 that are arranged in rows and columns. Each pixel 3 includes a light sensitive element, such as a photodiode, or the like, to sample light intensity of a corresponding portion of a scene being imaged, and each pixel 3 is configured to produce an analog pixel signal based on the sampled light intensity. The row driver 4 supplies control signals to the pixels 3 in the pixel array 2 to control operations of the pixels 3.

Pixels 3 that are in a same row of the pixel array 2 share common row control signals from the row driver 4. For example, pixels 3 in a first row of the pixel array 2 share common row control lines $5_1$ for receiving control signals from the row driver 4. Similarly, pixels 3 in a second row of the pixel array 2 share common row control lines $5_2$ for receiving control signals from the row driver 4, and pixels 3 in an $n^{th}$ row of the pixel array 2 share common row control lines $5_n$ for receiving control signals from the row driver 4. Pixels 3 that are in a same column of the pixel array 2 share a common column readout line to provide output. For example, pixels 3 in a first column of the pixel array 2 share a column readout line $6_1$, pixels 3 in a second column of the pixel array 2 share a column readout line $6_2$, and pixels 3 in an $m^{th}$ column of the pixel array 2 share a column readout line $6_m$. The row driver 4 controls the pixels 3 to provide output row by row.

FIG. 2 illustrates a schematic of an example design of the pixel 3. The pixel 3 in FIG. 2 is typically called a four transistor (4T) pixel. The pixel 3 includes a photodiode 21, a transfer transistor 28, a floating diffusion 23, a reset transistor 24, a source follower transistor 25, and a row select transistor 26. The transfer transistor 28, the reset transistor 24, the source follower transistor 25, and the row select transistor 26 may each comprise, for example, an n-channel metal-oxide semiconductor field effect transistor (NMOS transistor), or the like.

The pixel 3 illustrated in FIG. 2 is provided as an example of a pixel in an $i^{th}$ row and a $j^{th}$ column of a pixel array, such as the pixel array 2 (refer to FIG. 1), and the pixel 3 receives a transfer control signal (TX) over a transfer signal line $5_{i1}$, a reset control signal (RST) over a reset signal line $5_{i2}$, and a row select control signal (ROW) over a row select signal line $5_{i3}$. The transfer signal line $5_{i1}$, the reset signal line $5_{i2}$, and the row select signal line $5_{i3}$ are shared by all pixels in an $i^{th}$ row of a pixel array, such as the pixel array 2 (refer to FIG. 1), and the transfer control signal TX, the reset control signal RST, and the row select control signal ROW are provided from a row driver, such as the row driver 4 (refer to FIG. 1). The pixel 3 in FIG. 2 provides output to a column readout line $6_j$.

As illustrated in FIG. 2, an anode of the photodiode 21 is connected to a fixed voltage, such as gound or another suitable voltage, and a cathode of the photodiode 21 is connected to a first terminal of the transfer transistor 28. A gate 22 of the transfer transistor 28 is connected to the transfer signal line $5_{i1}$, and the gate 22 of the transfer transistor 28 may also be called the transfer gate 22. A second terminal of the transfer transistor 28 is connected to the floating diffusion 23. A first terminal of the reset transistor 24 is connected to the floating diffusion 23, and a second terminal of the reset transistor 24 is connected to a supply voltage ($V_{dd}$) provided from a power supply. A gate of the reset transistor 24 is connected to the reset signal line $5_{i2}$. A first terminal of the source follower transistor 25 is connected to the supply voltage $V_{dd}$ provided from the power supply, and a second terminal of the source follower transistor 25 is connected to a first terminal of the row select transistor 26. A gate of the source follower transistor 25 is connected to the floating diffusion 23. A second terminal of the row select transistor 26 is connected to the column readout line $6_j$. A gate of the row select transistor 26 is connected to the row select signal line $5_{i3}$.

FIG. 3 illustrates an example of an implementation of the pixel 3 from FIG. 2. The pixel 3 illustrated in FIG. 3 is provided as an example of a pixel in a $j^{th}$ column of a pixel array, such as the pixel array 2 (refer to FIG. 1). The pixel 3 includes a substrate 27, the photodiode 21, the transfer gate 22, the floating diffusion (FD) 23, the reset transistor 24, the source follower transistor (SF) 25, and the row select transistor 26. The floating diffusion 23 may also be called a storage diffusion and serves as a sense node or a readout node for the pixel 3. The photodiode 21 may be, for example, a pinned photodiode (PPD) that collects charge during exposure based on the light intensity of a corresponding portion of a scene being imaged. The transfer gate 22 is connected to receive the transfer control signal TX, and the transfer gate 22 is controllable by the transfer control signal TX to transfer charge from the photodiode 21 to the floating diffusion 23.

The gate of the reset transistor 24 is connected to receive the reset control signal RST. The first terminal of the reset transistor 24 is connected to the floating diffusion 23 and to the gate of the source follower transistor 25. The gate of the source follower transistor 25 is connected to the floating diffusion 23 and to the first terminal of the reset transistor 24. The first terminal of the source follower transistor 25 is connected to the power supply that supplies the supply voltage $V_{dd}$. The second terminal of the source follower transistor 25 is connected to the first terminal of the row select transistor 26. The gate of the row select transistor 26 is connected to receive the row select control signal (ROW). The second terminal of the row select transistor 26 is connected to the column readout line $6_j$ for providing the pixel output signal (pout) for the pixel 3 on the column readout line $6_j$. Thus, the pixel 3 is controlled with the control signals TX, RST, and ROW, and the pixel 3 provides the pixel output signal pout.

An operation of the pixel 3 in FIGS. 2 and 3 during a shutter operation may proceed as follows: (i) a row driver, such as the row driver 4 (refer to FIG. 1) provides a HIGH signal for the reset control signal RST on the reset signal line $5_{i2}$ and a HIGH signal for the transfer control signal TX on the transfer signal line $5_{i1}$ to discharge the photodiode 21 and reset the floating diffusion 23; (ii) the row driver provides a LOW signal for the reset control signal RST on the reset signal line $5_{i2}$ and a LOW signal for the transfer control signal TX on the transfer signal line $5_{i1}$ to close the gate of the reset transistor 24 and the transfer gate 22 for an exposure time during which the photodiode 21 accumulates charge from sensed light, and the row driver provides a HIGH signal for the row select control signal ROW on the row select signal line $5_{i3}$ to read out a potential (the reset value) of the empty floating diffusion node 23 over the column readout line $6_j$ and then provides a LOW signal for the row select control signal ROW on the row select signal line $5_{i3}$; (iii) the row driver provides a HIGH signal for the transfer control signal TX on the transfer signal line $5_{i1}$ to open the transfer gate 22 to transfer the accumulated charge from the photodiode 21 to the floating diffusion 23; (iv) the row driver provides a LOW signal for the transfer control signal TX on the transfer signal line $5_{i1}$ to close the transfer gate 22 to hold the charge at the floating diffusion 23; and (v) when charge from the row in which the pixel 3 is located is to be read out, the row driver provides a HIGH signal for the row select control signal ROW on the row select signal line $5_{i3}$ to open the gate of the row select transistor 26 to provide output to the column readout line $6_j$.

The reset value corresponding to the reset potential at the floating diffusion node 23 after reset, and the pixel signal corresponding to the charge at the floating diffusion node 23 for the image capture operation are provided to a corresponding column readout circuit 8 (refer to FIG. 1) for the column in which the pixel 3 is located. The column readout circuit 8 digitizes a difference between the pixel signal and the signal of the reset potential to provide a digital output representing the charge collected by the pixel 3 during the corresponding exposure. During readout, therefore, the floating diffusion that serves as a readout node is reset to a high voltage, and then it is filled with the signal charge, and the difference of the potential between the reset (empty) readout node and the readout node with charge is used to determine the output pixel value.

With reference again to FIG. 1, the column readout circuitry 7 includes a column readout circuit 8 for each column of pixels 3 in the pixel array 2. Each column readout circuit 8 is connected to receive analog signals from a corresponding column readout line, and is configured to provide digital output on a corresponding output line. For example, the column readout circuit 8 for the first column is connected to the column readout line $6_1$ for receiving input, and is connected to an output line $11_1$ for providing output. Similarly, the column readout circuit 8 for the second column is connected to the column readout line $6_2$ for receiving input, and is connected to an output line $11_2$ for providing output, and the column readout circuit 8 for the $m^{th}$ column is connected to the column readout line $6_m$ for receiving input, and is connected to an output line $11_m$ for providing output. The column circuit timing controller 9 is configured to provide control signals to the plurality of column readout circuits 8 over one or more control lines 10.

In the pixel 3 of FIG. 3, the substrate 27 has a p type doping and the floating diffusion 23 is an $n^+$ doped region in the substrate 27. Once the pixel 3 has been manufactured, the floating diffusion 23 has a fixed capacitance. In other words, the readout node for the pixel 3, which is the floating diffusion 23, has a fixed capacitance.

SUMMARY OF THE DISCLOSURE

A pixel in accordance with an embodiment includes a photodiode and a readout node for receiving charge trans- ferred from the photodiode. The readout node is configured to have a variable capacitance that is non-linear with respect to a voltage at the readout node. In various embodiments, the readout node is resettable and the readout node is configured to have a lower capacitance when reset to a reset voltage than when getting filled with charge from the photodiode.

In some embodiments, the readout node is configured such that the capacitance of the readout node continuously changes as additional charge is received by the readout node after the readout node is reset. Also, in some embodiments, the readout node is configured such that the capacitance of the readout node continuously increases as additional charge is received by the readout node after the readout node is reset.

In some embodiments, the readout node is configured such that the capacitance of the readout node is a first capacitance when the readout node is reset and such that the capacitance of the readout node jumps from the first capacitance to a second capacitance that is higher than the first capacitance after the readout node has been filled with a certain amount of charge. Also, in some embodiments, the readout node is configured to have a first level of capacitance after being reset and to have a second level of capacitance after receiving a certain amount of charge.

In various embodiments, the readout node is configured such that the capacitance of the readout node is changeable within a range from 0.5 fF to 5 fF as the readout node receives charge from the photodiode.

In various embodiments, the pixel further includes a substrate having a bottom portion and having a top portion that has a higher doping concentration of a first dopant than the bottom portion. In some embodiments, the readout node includes a floating diffusion that includes a region of a second dopant in the substrate that is configured such that a depletion layer due to at least a certain level of voltage at the floating diffusion extends from a surface of the substrate through the top portion of the substrate and into the bottom portion of the substrate. In various embodiments, the first dopant is a p type dopant and the second dopant is an n type dopant.

In various embodiments, the readout node includes a floating diffusion in a substrate and a buried channel in the substrate adjacent to the floating diffusion. In some embodiments, the buried channel is a channel of a junction field effect transistor. In some embodiments, the photodiode includes a particular buried channel in the substrate, and the buried channel and the particular buried channel are both formed from arsenic.

In various embodiments, the readout node includes a floating diffusion in a substrate and a metal oxide semiconductor field effect transistor controlled channel adjacent to the floating diffusion. In some embodiments, the pixel further includes a metal oxide semiconductor field effect transistor having a gate that is connected to ground. Also, in some embodiments, the readout node includes a floating diffusion and a channel of the metal oxide semiconductor field effect transistor adjacent to the floating diffusion.

In various embodiments, the readout node includes a floating diffusion in a substrate and a metal oxide semiconductor field effect transistor adjacent to the floating diffusion. In some embodiments, a gate of the metal oxide semiconductor field effect transistor is connected to receive a reference voltage. In some embodiments, a gate of the metal oxide semiconductor field effect transistor is grounded and the metal oxide semiconductor field effect transistor is a depletion mode metal oxide semiconductor field effect transistor. In some embodiments, the gate of the metal oxide semiconductor field effect transistor is grounded by a wire to a contact on the substrate.

In various embodiments, the readout node includes a floating diffusion in a substrate and the readout node also includes a portion of a barrier region that includes a portion of a barrier layer doped with a dopant adjacent to the floating diffusion. In some embodiments, the pixel further includes a transfer gate for controlling a transfer of charge from the photodiode, and the floating diffusion is located on an opposite side of the barrier region from the transfer gate.

In various embodiments, the readout node includes a floating diffusion in a substrate and a portion of a barrier region. In various embodiments, the portion of the barrier region includes a portion of a barrier layer and a barrier channel. In various embodiments, at least a portion of the barrier channel extends below the barrier layer. In some embodiments, the barrier layer is a $p^+$ barrier layer and the barrier channel is an $n^-$ barrier channel. In various embodiments, the portion of the barrier region is located adjacent to the floating diffusion and is configured to provide a potential well with a different level than a level of a potential well of the floating diffusion when the floating diffusion is reset. Also, in various embodiments, the floating diffusion and the portion of the barrier region are configured to provide potential wells of different levels when the readout node is reset.

In various embodiments, the readout node includes a floating diffusion in a substrate and a portion of a channel under a transfer gate. In some embodiments, the portion of the channel includes an $n^-$ area that is formed from an n type dopant. In some embodiments, the portion of the channel is doped with arsenic. In various embodiments, the pixel further includes a $p^+$ barrier located under a portion of the transfer gate. In some embodiments, the transfer gate does not have any threshold adjust implant. In some embodiments, the transfer gate includes a threshold adjust implant.

An image sensor in accordance with an embodiment includes a pixel array having a plurality of pixels arranged in rows and columns. In various embodiments, each pixel of the plurality of pixels in the pixel array includes a photodiode and a readout node for receiving charge transferred from the photodiode and that is configured to have a variable capacitance that is non-linear with respect to a voltage at the readout node.

A method in accordance with an embodiment includes storing charge in a potential well of a floating diffusion of a pixel of an image sensor and then storing, after the amount of charge in the potential well of the floating diffusion has reached a particular level, charge in both the potential well of the floating diffusion and in an additional potential well adjacent to the potential well of the floating diffusion. In various embodiments, the method further includes reading out from the pixel a signal representing an amount of charge stored in the potential well of the floating diffusion and in the additional potential well.

In various embodiments, the additional potential well adjacent to the potential well of the floating diffusion is provided by a portion of a barrier region that includes a portion of a barrier layer and a barrier channel. In some embodiments, the additional potential well adjacent to the potential well of the floating diffusion is provided by a portion of a channel under a transfer gate that transfers charge from a photodiode of the pixel. In some embodiments, the method further includes preventing, by a barrier under at least a portion of the transfer gate, charge from spilling back into the photodiode from the additional potential well adjacent to the potential well of the floating diffusion. In some embodiments, the additional potential well adjacent to the potential well of the floating diffusion is provided at least in part by a buried channel in a substrate.

BRIEF DESCRIPTION OF THE DRAWINGS

FIG. 11A shows an implementation of a pixel in accordance with an embodiment having a variable capacitance readout node including a portion of a barrier region doped with a dopant adjacent to a floating diffusion.

FIG. 11B shows an associated potential diagram for the pixel of FIG. 11A.

FIG. 13A shows an implementation of a pixel in accordance with an embodiment having a variable capacitance readout node.

FIG. 13B shows an associated potential diagram for the pixel of FIG. 13A.

DETAILED DESCRIPTION

Figure 1:
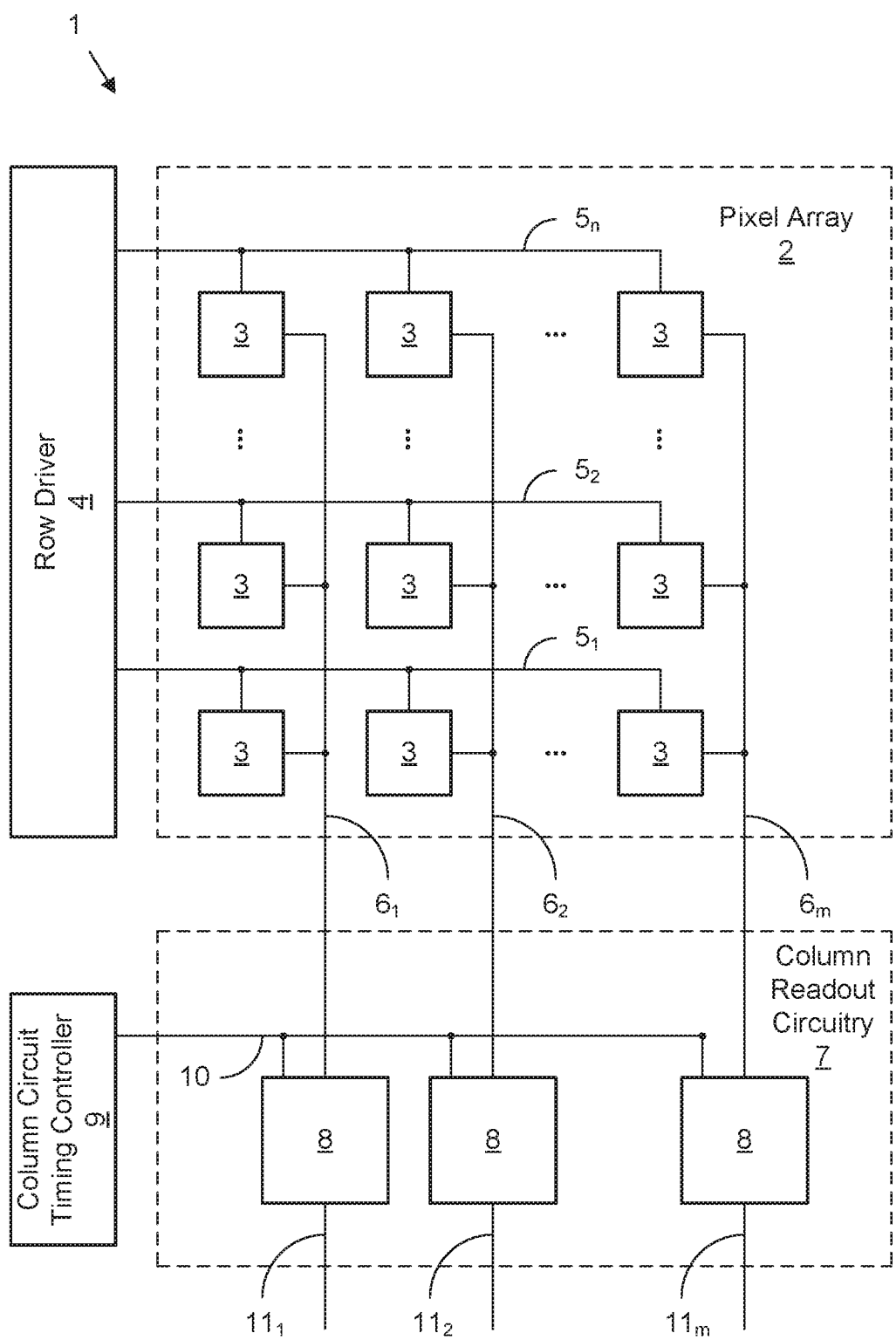
FIG. 1 shows an architecture of a related art image sensor.
Figure 2:
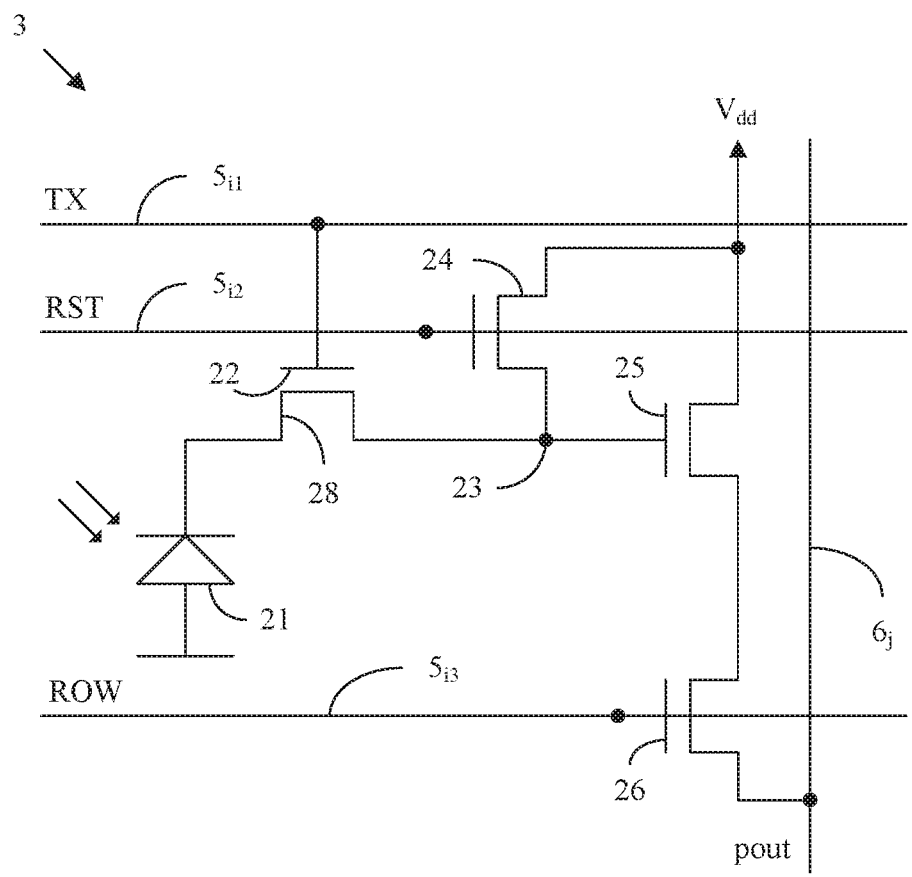
FIG. 2 shows a schematic of an example design of a related art four transistor pixel.
Figure 3:
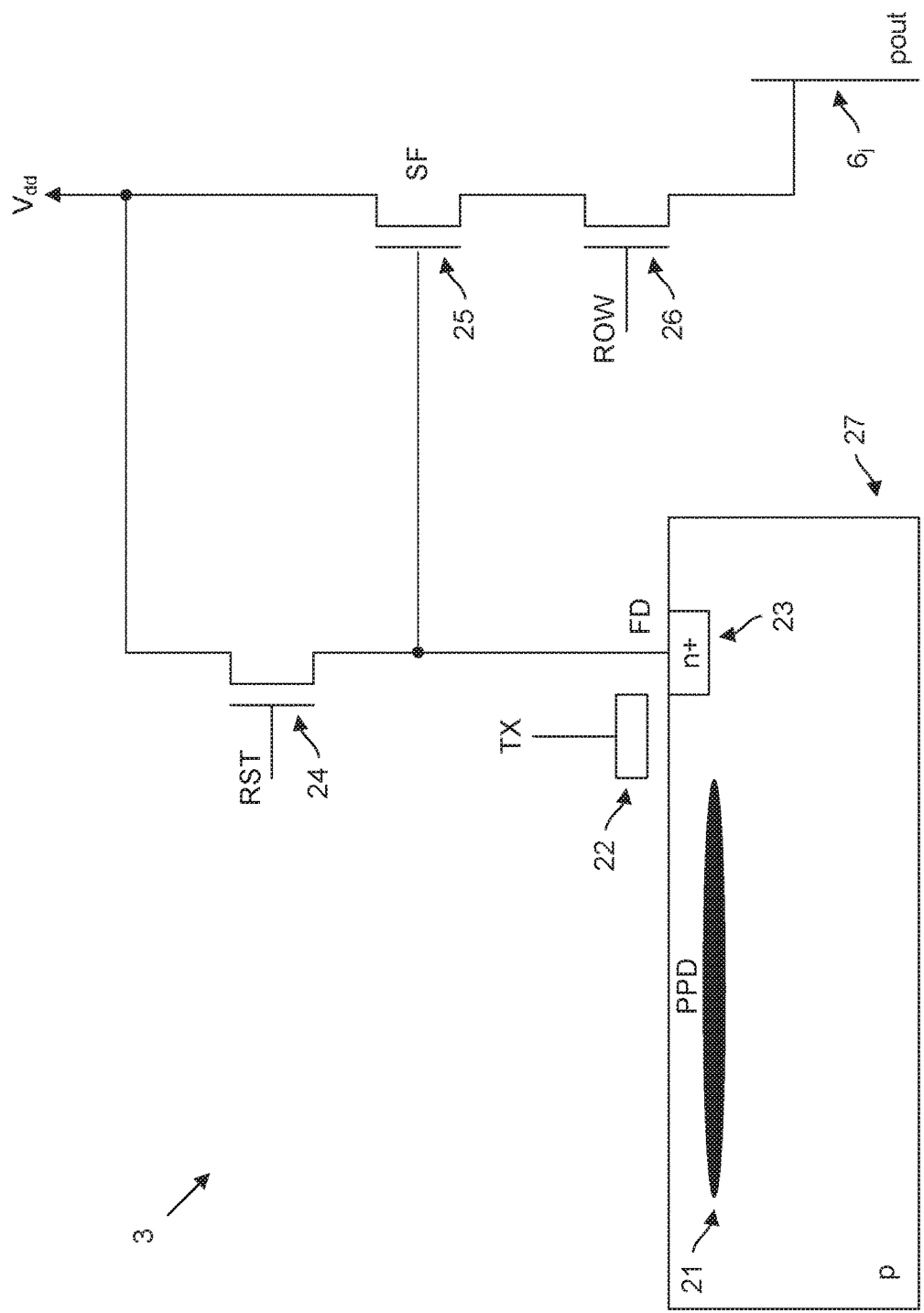
FIG. 3 shows an example implementation of the pixel of FIG. 2 with a p type substrate having an $n^+$ floating diffusion.

A pixel in accordance with an embodiment includes a photodiode and a readout node for receiving charge transferred from the photodiode, where the readout node is configured to have a variable capacitance that is non-linear with respect to a voltage at the readout node. By forming a readout node with a variable capacitance instead of a fixed capacitance, the pixel allows for having both low readout noise and a high dynamic range. A high dynamic range pixel with a variable capacitance readout node in accordance with an embodiment thus has advantages over a pixel with a fixed capacitance readout node.

With a fixed capacitance readout node, there is a tradeoff between high sensitivity and handling capacity. If a fixed capacitance readout node is designed to have a small capacitance then that would result in a high conversion gain, because adding a small signal charge would cause a large change in the potential at the readout node. This would provide for a high sensitivity and a low readout noise, especially if a Correlated Double Sampling (CDS) technique is used. The drawback of having the small capacitance for the fixed capacitance readout node, however, is reduced handling capacity. With a small capacitance, the pixel saturation or full well charge would be small, so the pixel dynamic range and the signal to noise ratio at one-half of saturation would be small.

As a practical example, if the readout node has a fixed capacitance of 0.8 fF, and the signal voltage swing (the potential difference between the reset and filled readout node) is 1 V, then the saturation charge is 5,000 e−. The typical noise in such a case (with CDS) could be 2 e−, so the pixel dynamic range would be limited by the floating diffusion capacitance to 68 dB.

On the other hand, if a fixed capacitance readout node is designed to have a large capacitance, then the handling capacity or saturation could be high, but the conversion gain is low, and the noise is high. For example, with an 8 fF fixed readout capacitance, the saturation charge could be 50,000 e−, and the noise is 20 e−, resulting in the dynamic range of 68 dB.

Various embodiments of pixels as disclosed herein use a variable capacitance readout node starting at a small capacitance to achieve high conversion gain and thus low noise for small signals, and then turning into a large readout capacitance with a large saturation charge to handle large signals. In various embodiments, a variable readout capacitance at the readout node is small when there is a high voltage at the readout node, such as when the readout node is reset to a reset voltage level, and the variable readout capacitance turns into a larger capacitance upon filling of a potential well of the readout node with signal electrons.

For example, a pixel in accordance with an embodiment has a floating readout capacitance changing from 0.8 fF to 8 fF during the filling of the readout node with the signal charge. The noise in dark could be 2 e− while the saturation charge could be 20,000 e−. Thus, the dynamic range of such a pixel would be 80 dB. Accordingly, having a variable capacitance readout node allows for the pixel to have both high sensitivity and high dynamic range. In some embodiments, a floating readout capacitance changes from 0.5 fF to 5 fF during the filling of the readout node with the signal charge.

Various embodiments disclosed herein provide different techniques for building a variable capacitance readout node. In some embodiments, there is a modification of a substrate doping of the wafer with pixels to produce a variable capacitance readout node. A higher concentration of the substrate doping results in higher capacitance of a p-n junction manufactured on such a substrate. In various embodiments, the manufacturing process begins with a substrate with low doping concentration and then the doping close to the surface of the substrate is increased by implanting more of the doping material. In some such embodiments, the capacitance of an n+/p diffusion for the readout node grows with reducing the potential on it. The variable readout capacitance allows for achieving both low noise and a high saturation point.

Figure 4A:
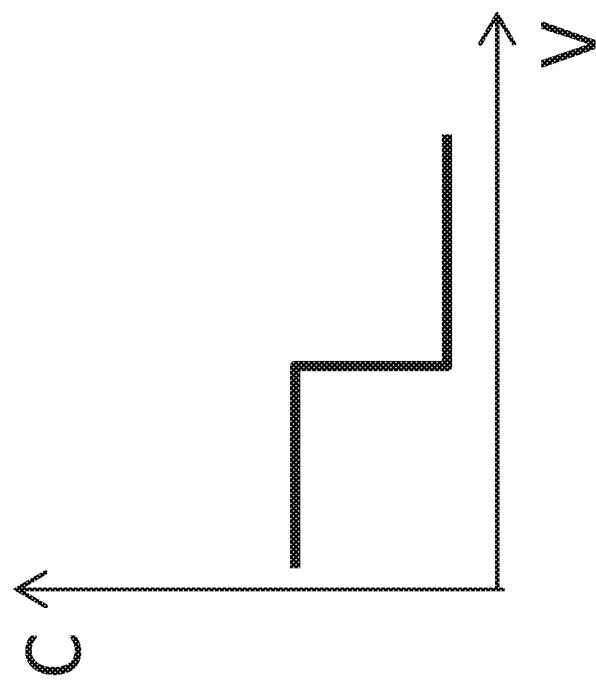
FIG. 4A shows an example of a graph of capacitance versus voltage for a variable capacitance readout node with a continuous change in capacitance across a voltage range.

FIG. 4A shows an example of a graph of capacitance (C) versus voltage (V) for a variable capacitance readout node in a case where the capacitance continuously changes across a range of voltage for the readout node. The example curve in FIG. 4A shows a low capacitance for the readout node at a high pixel reset point when the pixel is reset to a reset voltage, and also shows that the capacitance of the readout node gets continuously higher as the voltage at the readout node is reduced as more charge is stored at the readout node up to a charge saturation point.

In various embodiments, a pixel includes a readout node that is configured to have a lower capacitance when reset to a reset voltage than when getting filled with charge from a photodiode. In some embodiments, the readout node is configured such that the capacitance of the readout node continuously changes as additional charge is received by the readout node after the readout node is reset. In some embodiments, the readout node is configured such that the capacitance of the readout node continuously increases as additional charge is received by the readout node after the readout node is reset. In various embodiments, the readout node is configured such that the capacitance of the readout node is changeable within a range from 0.5 fF to 5 fF as the readout node receives charge from the photodiode.

Other techniques for providing a variable capacitance readout node in accordance with various embodiments disclosed herein include implementing a junction field-effect transistor (JFET) or a metal oxide semiconductor field effect transistor (MOSFET) adjacent to a floating diffusion in a pixel, so that after partial filling of the floating diffusion, charge starts filling an additional area controlled by the JFET or MOSFET. Yet another technique for providing a variable capacitance readout node in accordance with various embodiments disclosed herein includes having a portion of a barrier layer adjacent to a floating diffusion doped with a dopant to allow for storing charge at that portion of the barrier layer after storing a certain amount of charge at the floating diffusion.

Figure 4B:
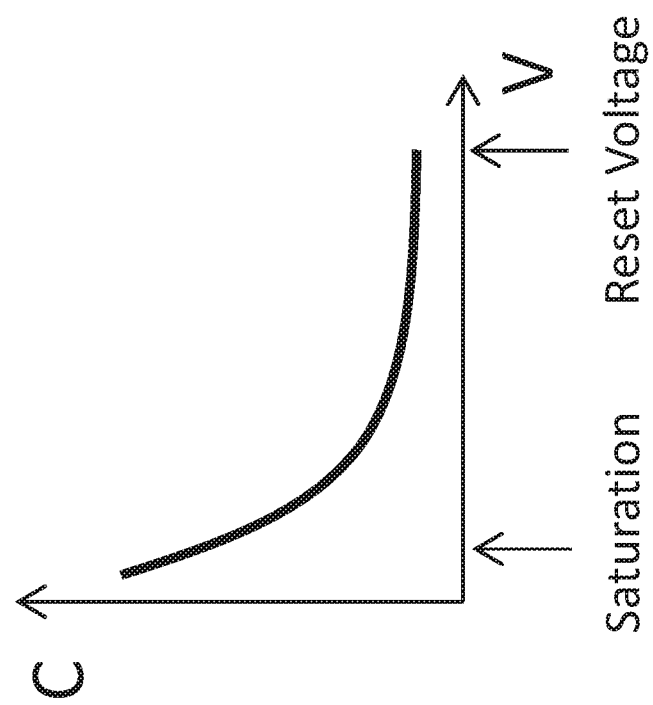
FIG. 4B shows an example graph of capacitance versus voltage for a readout node in which there is a two-step capacitance.

FIG. 4B shows an example graph of capacitance (C) versus voltage (V) for a readout node in which there is a two-step capacitance with a low capacitance at high voltage and a higher capacitance at low voltage such as by having the MOSFET or JFET channel capacitance added at lower voltage or adding the capacitance of a portion of a doped barrier layer at lower voltage once a sufficient amount of charge has already accumulated in a floating diffusion. In various embodiments, a readout node is configured such that the capacitance of the readout node is a first capacitance when the readout node is reset and such that the capacitance of the readout node jumps from the first capacitance to a second capacitance that is higher than the first capacitance after the readout node has been filled with a certain amount of charge. In some embodiments, the readout node is configured to have a first level of capacitance after being reset and to have a second level of capacitance after receiving a certain amount of charge.

Figure 5:
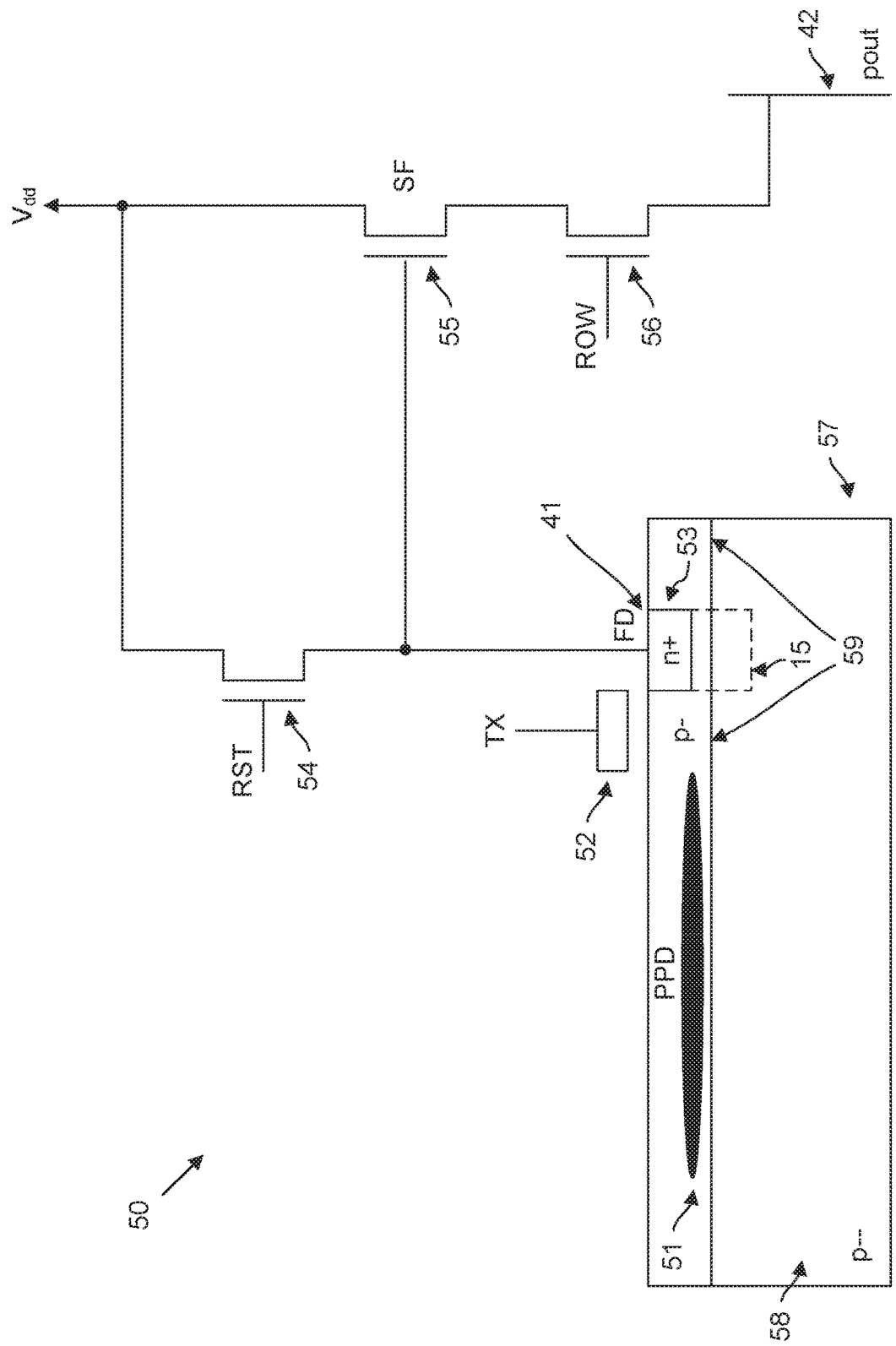
FIG. 5 shows an implementation of a pixel in accordance with an embodiment having a variable capacitance readout node.

FIG. 5 shows an implementation of a pixel 50 in accordance with an embodiment having a variable capacitance readout node 41. The pixel 50 includes a substrate 57, a photodiode 51, a transfer gate 52, a floating diffusion (FD) 53, a reset transistor 54, a source follower transistor (SF) 55, and a row select transistor 56. The floating diffusion 53 serves as the readout node 41 for the pixel 50. The photodiode 51 may be, for example, a pinned photodiode (PPD) that collects charge during exposure based on the light intensity of a corresponding portion of a scene being imaged. The transfer gate 52 is connected to receive a transfer control signal (TX), and the transfer gate 52 is controllable by the transfer control signal TX to transfer charge from the photodiode 51 to the floating diffusion 53. The reset transistor 54, the source follower transistor 55, and the row select transistor 56 may each comprise, for example, an n-channel metal oxide semiconductor field effect transistor (NMOS transistor), or the like.

A gate of the reset transistor 54 is connected to receive a reset control signal (RST). A first terminal of the reset transistor 54 is connected to the floating diffusion 53 and to a gate of the source follower transistor 55. A second terminal of the reset transistor 54 is connected to a power supply that supplies a supply voltage $V_{dd}$. The gate of the source follower transistor 55 is connected to the floating diffusion 53 and to the first terminal of the reset transistor 54. A first terminal of the source follower transistor 55 is connected to the power supply that supplies the supply voltage $V_{dd}$. A second terminal of the source follower transistor 55 is connected to a first terminal of the row select transistor 56. A gate of the row select transistor 56 is connected to receive a row select control signal (ROW). A second terminal of the row select transistor 56 is connected to a column readout line 42 for providing a pixel output signal (pout) for the pixel 50 on the column readout line 42. Thus, the pixel 50 is controlled with the control signals TX, RST, and ROW, and the pixel 50 provides the pixel output signal pout.

The substrate 57 has a bottom portion 58 and a top portion 59. The top portion 59 of the substrate 57 has a higher doping concentration of a first dopant than the bottom portion 58 of the substrate 57. In various embodiments, the bottom portion 58 of the substrate 57 is a very lightly doped or almost intrinsic region of the substrate 57, such as a p⁻⁻ region, and the top portion 59 of the substrate 57 is a region with a higher doping concentration than the bottom portion 58, such as being a thin p⁻ doped surface layer.

In various embodiments, the manufacturing of the pixel 50 begins with a lightly doped (e.g. $10^{14}$ cm$^{-3}$) substrate 57 or an epi-layer of (4-7 μm thickness) and then includes implanting a thin layer of a p type dopant, such as Boron (an examplar condition is 50 keV $2\times10^{12}$ cm$^{-2}$), to have a higher doped p⁻ layer near the surface, such that the top portion 59 of the substrate 57 is a higher doped layer than the bottom portion 58 of the substrate 57. The readout node 41 is the floating diffusion 53 that is formed by a region of a second dopant in the substrate 57 and is configured such that a depletion layer 15 when there is at least a certain level of voltage at the floating diffusion 53 extends from a surface of the substrate 57 through the top portion 59 of the substrate 57 and into the bottom portion 58 of the substrate 57. In various embodiments, the dopant for the floating diffusion 53 is an n type dopant, such as arsenic or phosphorus, and the floating diffusion 53 is an n⁺ region.

In various embodiments, when the floating diffusion 53 is reset to a reset voltage of, for example approximately +3 V, the depletion layer 15 of the floating diffusion 53 is much deeper than a thickness of the p⁻ layer of the top portion 59 of the substrate 57, so the capacitance of the floating diffusion 53 is small at that voltage. As the floating diffusion 53 starts to be filled with charge from the photodiode 51 that reduces a voltage at the floating diffusion 53, the depletion layer 15 of the floating diffusion 53 collapses from where it is illustrated in FIG. 5 and when it enters the surface layer, the capacitance of the floating diffusion 53 grows. In various embodiments, the capacitance of the floating diffusion 53 changes according to a curve such as shown in FIG. 4A with a change in voltage at the floating diffusion 53. Thus, the readout node 41, which is the floating diffusion 53 in the pixel 50, is configured to have a variable capacitance that is non-linear with respect to a voltage at the readout node 41.

In various embodiments, the readout node 41 is configured to have a lower capacitance when reset to a reset voltage by the reset transistor 54 than when getting filled with charge from the photodiode 51. In various embodiments, the readout node 41 is configured such that the capacitance of the readout node 41 continuously changes as additional charge is received by the readout node 41 after the readout node 41 is reset. In various embodiments, the readout node 41 is configured such that the capacitance of the readout node 41 continuously increases as additional charge is received by the readout node 41 after the readout node 41 is reset. In various embodiments, the readout node 41 is configured such that the capacitance of the readout node 41 is changeable within a range from 0.5 fF to 5 fF as the readout node 41 receives charge from the photodiode 51.

An operation of the pixel 50 in FIG. 5 during a shutter operation may proceed as follows: (i) the reset control signal RST is set HIGH and the transfer control signal TX is set HIGH to discharge the photodiode 51 and reset the floating diffusion 53; (ii) the reset control signal RST is set LOW and the transfer control signal TX is set LOW to close the gate of the reset transistor 54 and the transfer gate 52 for an exposure time during which the photodiode 51 accumulates charge from sensed light, and the row select control signal ROW is set HIGH to read out a potential (the reset value) of the empty floating diffusion node 53 over the column readout line 42 and then the row select control signal ROW is set LOW; (iii) the transfer control signal TX is set HIGH to open the transfer gate 52 to transfer the accumulated charge from the photodiode 51 to the floating diffusion 53; (iv) the transfer control signal TX is set LOW to close the transfer gate 52 to hold the charge at the floating diffusion 53; and (v) the row select control signal ROW is set HIGH to open the gate of the row select transistor 56 to provide output to the column readout line 42 that is representative of an amount of charge stored at the floating diffusion 53.

Figure 6:
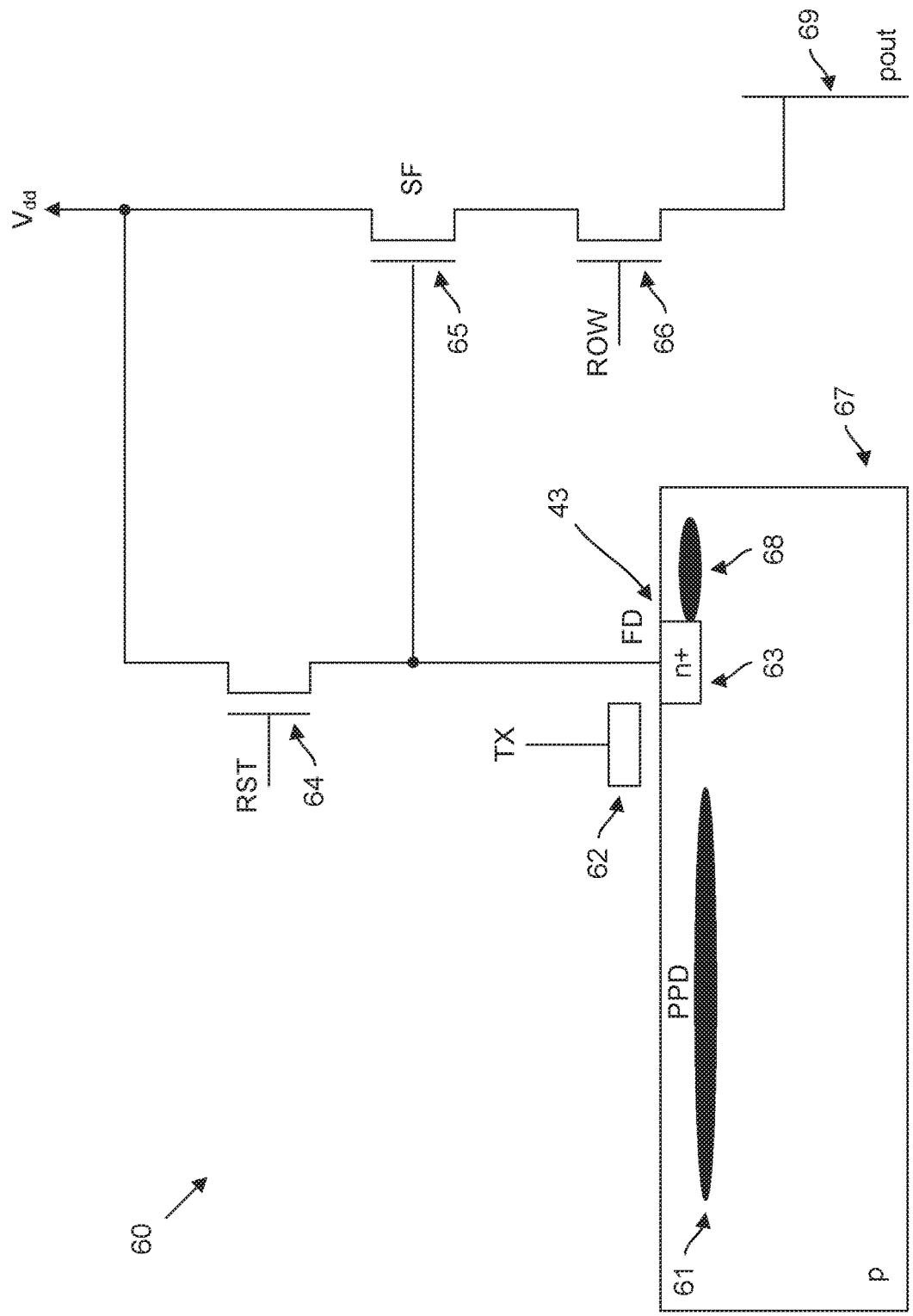
FIG. 6 shows an implementation of a pixel in accordance with an embodiment having a variable capacitance readout node including a buried channel adjacent to a floating diffusion.

FIG. 6 shows an implementation of a pixel 60 in accordance with an embodiment having a variable capacitance readout node 43 including a buried channel 68 adjacent to an n+ floating diffusion 63. The pixel 60 includes a substrate 67, a photodiode 61, a transfer gate 62, the floating diffusion (FD) 63, the buried channel 68, a reset transistor 64, a source follower transistor (SF) 65, and a row select transistor 66. The readout node 43 includes both the floating diffusion 63 and the buried channel 68, such that the floating diffusion 63 and the buried channel 68 together serve as the readout node 43 for the pixel 60. The photodiode 61 may be, for example, a pinned photodiode (PPD) that collects charge during exposure based on the light intensity of a corresponding portion of a scene being imaged. The transfer gate 62 is connected to receive a transfer control signal (TX), and the transfer gate 62 is controllable by the transfer control signal TX to transfer charge from the photodiode 61 to the floating diffusion 63. The reset transistor 64, the source follower transistor 65, and the row select transistor 66 may each comprise, for example, an n-channel metal oxide semiconductor field effect transistor (NMOS transistor), or the like.

A gate of the reset transistor 64 is connected to receive a reset control signal (RST). A first terminal of the reset transistor 64 is connected to the floating diffusion 63 and to a gate of the source follower transistor 65. A second terminal of the reset transistor 64 is connected to a power supply that supplies a supply voltage $V_{dd}$. The gate of the source follower transistor 65 is connected to the floating diffusion 63 and to the first terminal of the reset transistor 64. A first terminal of the source follower transistor 65 is connected to the power supply that supplies the supply voltage $V_{dd}$. A second terminal of the source follower transistor 65 is connected to a first terminal of the row select transistor 66. A gate of the row select transistor 66 is connected to receive a row select control signal (ROW). A second terminal of the row select transistor 66 is connected to a column readout line 69 for providing a pixel output signal (pout) for the pixel 60 on the column readout line 69. Thus, the pixel 60 is controlled with the control signals TX, RST, and ROW, and the pixel 60 provides the pixel output signal pout.

In various embodiments, the buried channel 68 is a junction field-effect transistor (JFET) channel. In some such embodiments, because the JFET buried channel 68 needed to add to the capacitance of the floating diffusion 63 is similar to a buried channel of the pinned photodiode 61, the buried channel 68 is manufactured simultaneously with the pinned photodiode 61 using the same masks. In various embodiments, the pinned photodiode 61 is built using a very shallow surface pinning implant, such as boron or BF2, and also a buried channel of arsenic (As). In various embodiments, the buried channel 68 is formed with arsenic. In some embodiments, there is a cut in a pinning implant mask for the floating diffusion 63 to reduce the floating diffusion 63 overall capacitance and avoid p+/n+ diode breakdown.

In various embodiments, the buried channel 68 is a JFET buried channel located adjacent to the floating diffusion 63 in a pixel, and is configured such that after partial filling of the floating diffusion 63, charge starts filling an additional area at the buried channel 68. In various embodiments, the capacitance of the readout node 43 changes with a step change such as shown in FIG. 4B in accordance with a change in voltage at the readout node 43. Thus, the readout node 43, which includes the floating diffusion 63 and the buried channel 68 in the pixel 60, is configured to have a variable capacitance that is non-linear with respect to a voltage at the readout node 43.

Figure 7:
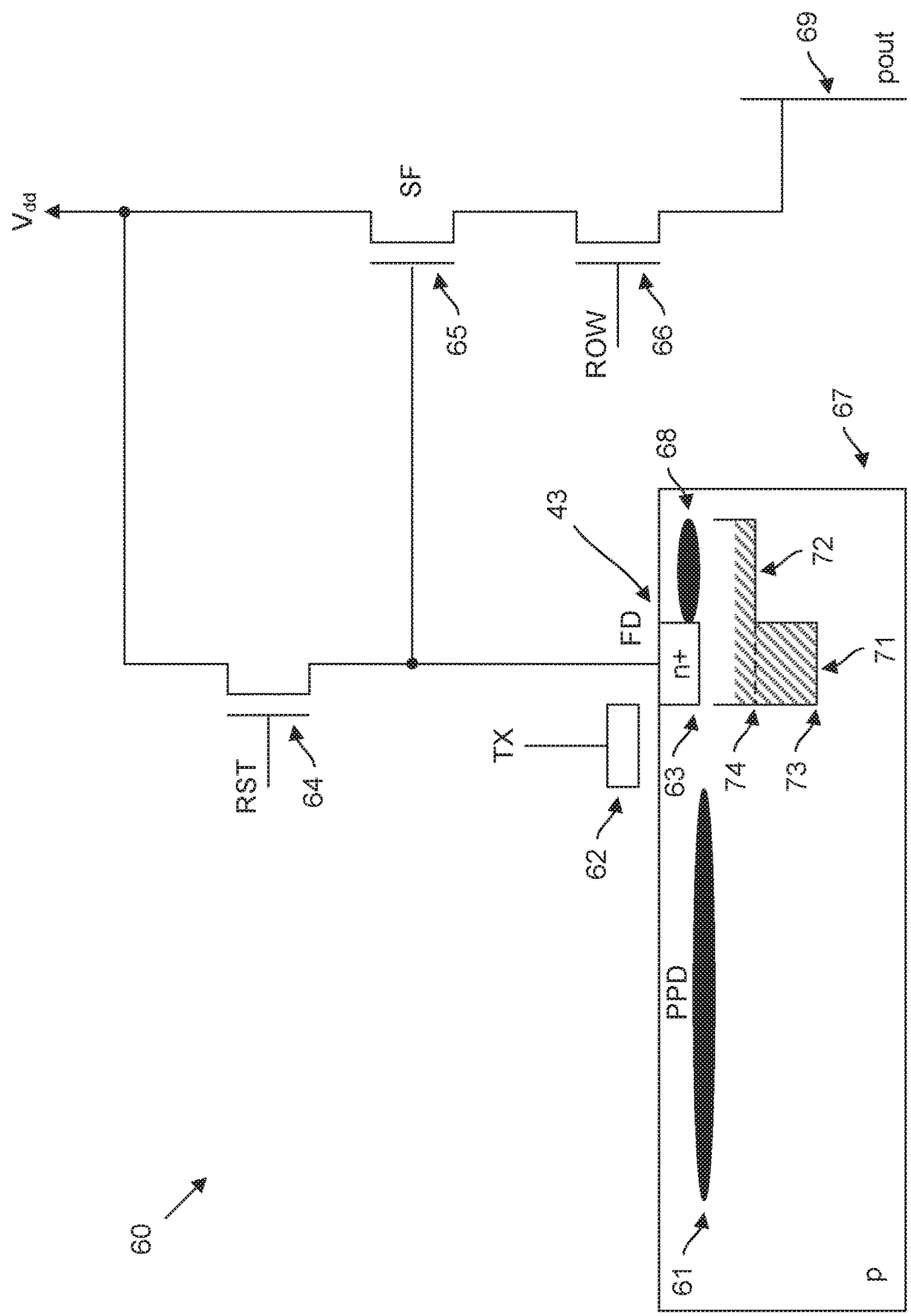
FIG. 7 shows the pixel of FIG. 6 with an additional illustration of potential wells for the floating diffusion and the buried channel.

FIG. 7 shows the pixel 60 of FIG. 6 with an additional illustration of potential wells for the floating diffusion 63 and the buried channel 68. Elements numbered with the same numbers in FIGS. 6 and 7 represent the same elements.

A potential well 71 for the floating diffusion 63 and a potential well 72 for the buried channel 68 are shown in FIG. 7. The potential well 71 is shown below the floating diffusion 63 and the potential well 72 is shown below the buried channel 68 just for illustration purposes. A level of the potential well 71 of the floating diffusion 63 is set to a reset level 73 when the floating diffusion 63 is reset. During a transfer of charge from the photodiode 61, the charge will first fill into the potential well 71 of the floating diffusion 63 up to a certain level 74 that is the reset level of the potential well 72 of the buried channel 68, and then after reaching that level additional charge will fill into both the potential well 71 of the floating diffusion 63 and the potential well 72 of the buried channel 68. This allows for the capacitance of the readout node 43 that includes the floating diffusion 63 and the buried channel 68 to jump to a higher value once a certain amount of charge has been accumulated.

In various embodiments, the readout node 43 is configured to have a lower capacitance when reset to a reset voltage by the reset transistor 64 than when filled with charge from the photodiode 61. In various embodiments, the readout node 43 is configured such that the capacitance of the readout node 43 is a first capacitance when the readout node 43 is reset and such that the capacitance of the readout node 43 jumps from the first capacitance to a second capacitance that is higher than the first capacitance after the readout node 43 has been filled with a certain amount of charge. Also, in various embodiments, the readout node 43 is configured to have a first level of capacitance after being reset and to have a second level of capacitance after receiving a certain amount of charge.

An operation of the pixel 60 in FIG. 6 during a shutter operation may proceed as follows: (i) the reset control signal RST is set HIGH and the transfer control signal TX is set HIGH to discharge the photodiode 61 and reset the readout node 43; (ii) the reset control signal RST is set LOW and the transfer control signal TX is set LOW to close the gate of the reset transistor 64 and the transfer gate 62 for an exposure time during which the photodiode 61 accumulates charge from sensed light, and the row select control signal ROW is set HIGH to read out a potential (the reset value) of the empty readout node 43 over the column readout line 69 and then the row select control signal ROW is set LOW; (iii) the transfer control signal TX is set HIGH to open the transfer gate 62 to transfer the accumulated charge from the photodiode 61 to the readout node 43; (iv) the transfer control signal TX is set LOW to close the transfer gate 62 to hold the charge at the readout node 43; and (v) the row select control signal ROW is set HIGH to open the gate of the row select transistor 66 to provide output to the column readout line 69 that is representative of an amount of charge stored at the readout node 43.

Figure 8:
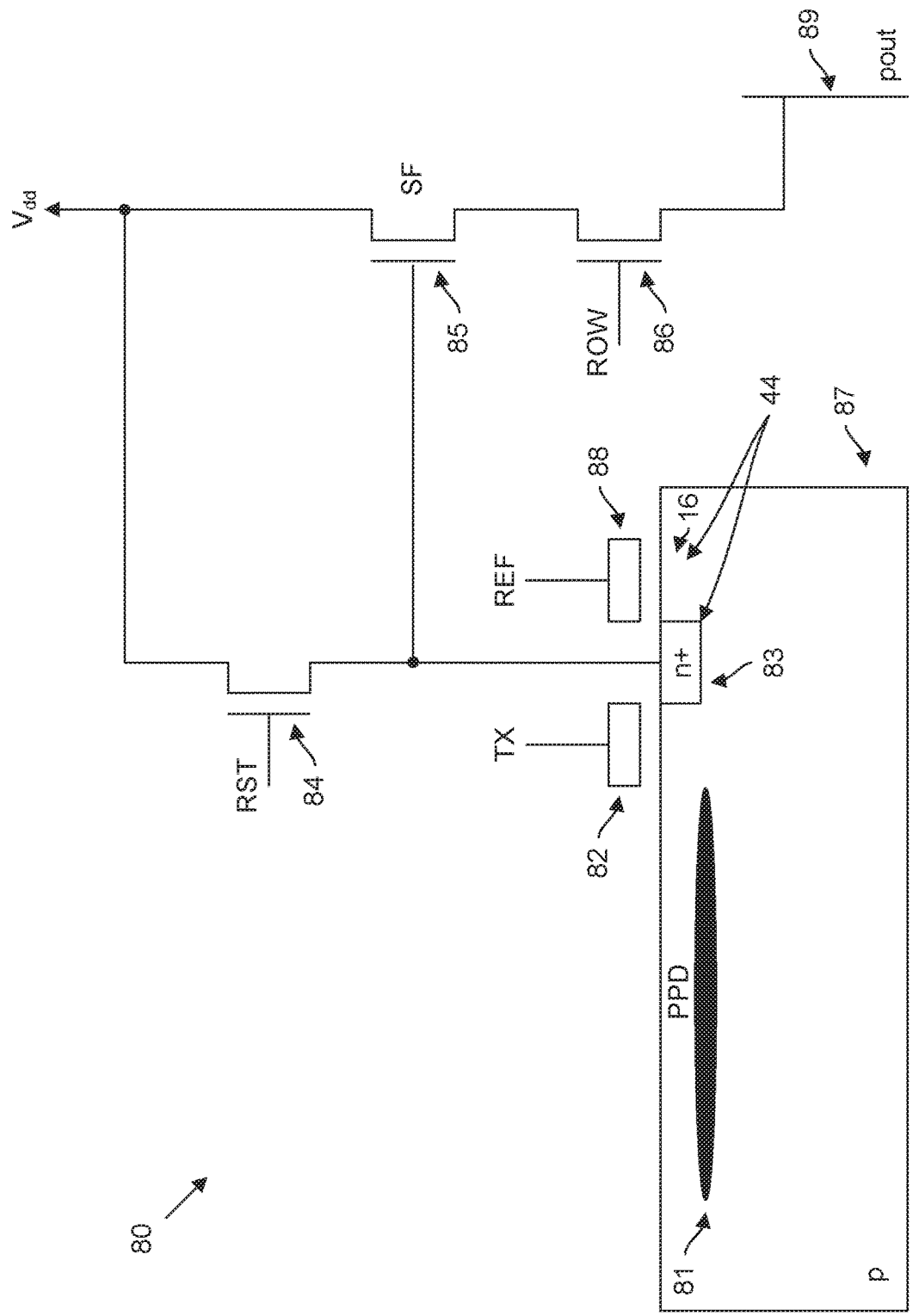
FIG. 8 shows an implementation of a pixel in accordance with an embodiment having a variable capacitance readout node including a metal oxide semiconductor field effect transistor (MOSFET) adjacent to a floating diffusion.

FIG. 8 shows an implementation of a pixel 80 in accordance with an embodiment having a variable capacitance readout node 44 including a metal oxide semiconductor field effect transistor (MOSFET) 88 adjacent to an n+ floating diffusion 83. The pixel 80 includes a substrate 87, a photodiode 81, a transfer gate 82, the floating diffusion 83, the MOSFET 88, a reset transistor 84, a source follower transistor (SF) 85, and a row select transistor 86. The readout node 44 includes both the floating diffusion 83 and a channel controlled by the MOSFET 88, such that the floating diffusion 83 and the channel controlled by the MOSFET 88 together serve as the readout node 44 for the pixel 80. The channel controlled by the MOSFET 88 is formed in the area labeled 16 adjacent to the floating diffusion 83 in FIG. 8. The photodiode 81 may be, for example, a pinned photodiode (PPD) that collects charge during exposure based on the light intensity of a corresponding portion of a scene being imaged. The transfer gate 82 is connected to receive a transfer control signal (TX), and the transfer gate 82 is controllable by the transfer control signal TX to transfer charge from the photodiode 81 to the floating diffusion 83. The reset transistor 84, the source follower transistor 85, and the row select transistor 86 may each comprise, for example, an n-channel metal oxide semiconductor field effect transistor (NMOS transistor), or the like.

A gate of the reset transistor 84 is connected to receive a reset control signal (RST). A first terminal of the reset transistor 84 is connected to the floating diffusion 83 and to a gate of the source follower transistor 85. A second terminal of the reset transistor 84 is connected to a power supply that supplies a supply voltage $V_{dd}$. The gate of the source follower transistor 85 is connected to the floating diffusion 83 and to the first terminal of the reset transistor 84. A first terminal of the source follower transistor 85 is connected to the power supply that supplies the supply voltage $V_{dd}$. A second terminal of the source follower transistor 85 is connected to a first terminal of the row select transistor 86. A gate of the row select transistor 86 is connected to receive a row select control signal (ROW). A second terminal of the row select transistor 86 is connected to a column readout line 89 for providing a pixel output signal (pout) for the pixel 80 on the column readout line 89. Thus, the pixel 80 is controlled with the control signals TX, RST, and ROW, and the pixel 80 provides the pixel output signal pout.

The MOSFET 88 is fabricated adjacent to the floating diffusion 83. In various embodiments, the adjacent (charge coupled) MOSFET 88 to the floating diffusion includes a charge control gate that is supplied with a reference voltage (REF). In various embodiments, this technique of using a reference voltage for the MOSFET 88 is attractive for large pixels where an additional bias line through the pixel for supplying the reference voltage is not an issue.

In various embodiments, the MOSFET 88 is located adjacent to the floating diffusion 83 in the pixel 80, and is configured such that after partial filling of the floating diffusion 83, charge starts filling an additional area in the channel of the MOSFET 88. In various embodiments, the capacitance of the readout node 44 changes with a step change such as shown in FIG. 4B in accordance with a change in voltage at the readout node 44. Thus, the readout node 44, which includes the floating diffusion 83 and the MOSFET 88 in the pixel 80, is configured to have a variable capacitance that is non-linear with respect to a voltage at the readout node 44.

Figure 9:
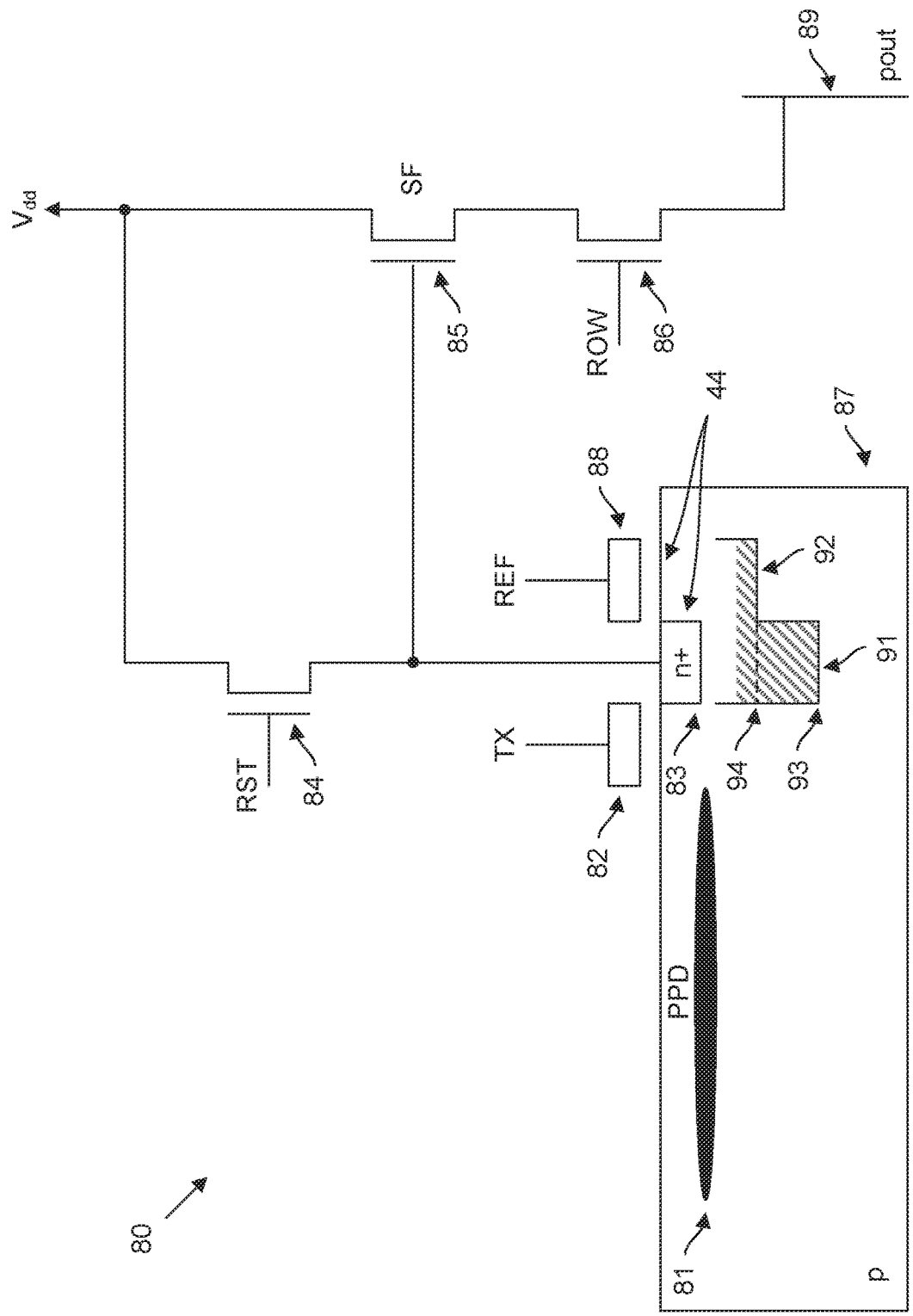
FIG. 9 shows the pixel of FIG. 8 with an additional illustration of potential wells for the floating diffusion and the MOSFET.

FIG. 9 shows the pixel 80 of FIG. 8 with an additional illustration of potential wells for the floating diffusion 83 and the channel of the MOSFET 88. Elements numbered with the same numbers in FIGS. 8 and 9 represent the same elements. A potential well 91 for the floating diffusion 83 and a potential well 92 for the channel of the MOSFET 88 are shown in FIG. 9. The potential well 91 is shown below the floating diffusion 83 and the potential well 92 is shown below the channel of the MOSFET 88 just for illustration purposes. A level of the potential well 91 of the floating diffusion 83 is set to a reset level 93 when the floating diffusion 83 is reset. During a transfer of charge from the photodiode 81, the charge will first fill into the potential well 91 of the floating diffusion 83 up to a certain level 94 that is the reset level of the potential well 92 of the channel of the MOSFET 88, and then after reaching that level additional charge will fill into both the potential well 91 of the floating diffusion 83 and the potential well 92 of the channel of the MOSFET 88. This allows for the capacitance of the readout node 44 that includes the floating diffusion 83 and the channel of the MOSFET 88 to jump to a higher value once a certain amount of charge has been accumulated.

In various embodiments, the readout node 44 is configured to have a lower capacitance when reset to a reset voltage by the reset transistor 84 than when filled with charge from the photodiode 81. In various embodiments, the readout node 44 is configured such that the capacitance of the readout node 44 is a first capacitance when the readout node 44 is reset and such that the capacitance of the readout node 44 jumps from the first capacitance to a second capacitance that is higher than the first capacitance after the readout node 44 has been filled with a certain amount of charge. Also, in various embodiments, the readout node 44 is configured to have a first level of capacitance after being reset and to have a second level of capacitance after receiving a certain amount of charge.

An operation of the pixel 80 in FIG. 8 during a shutter operation may proceed as follows: (i) the reset control signal RST is set HIGH and the transfer control signal TX is set HIGH to discharge the photodiode 81 and reset the readout node 44; (ii) the reset control signal RST is set LOW and the transfer control signal TX is set LOW to close the gate of the reset transistor 84 and the transfer gate 82 for an exposure time during which the photodiode 81 accumulates charge from sensed light, and the row select control signal ROW is set HIGH to read out a potential (the reset value) of the empty readout node 44 over the column readout line 89 and then the row select control signal ROW is set LOW; (iii) the transfer control signal TX is set HIGH to open the transfer gate 82 to transfer the accumulated charge from the photodiode 81 to the readout node 44; (iv) the transfer control signal TX is set LOW to close the transfer gate 82 to hold the charge at the readout node 44; and (v) the row select control signal ROW is set HIGH to open the gate of the row select transistor 86 to provide output to the column readout line 89 that is representative of an amount of charge stored at the readout node 44.

Figure 10:
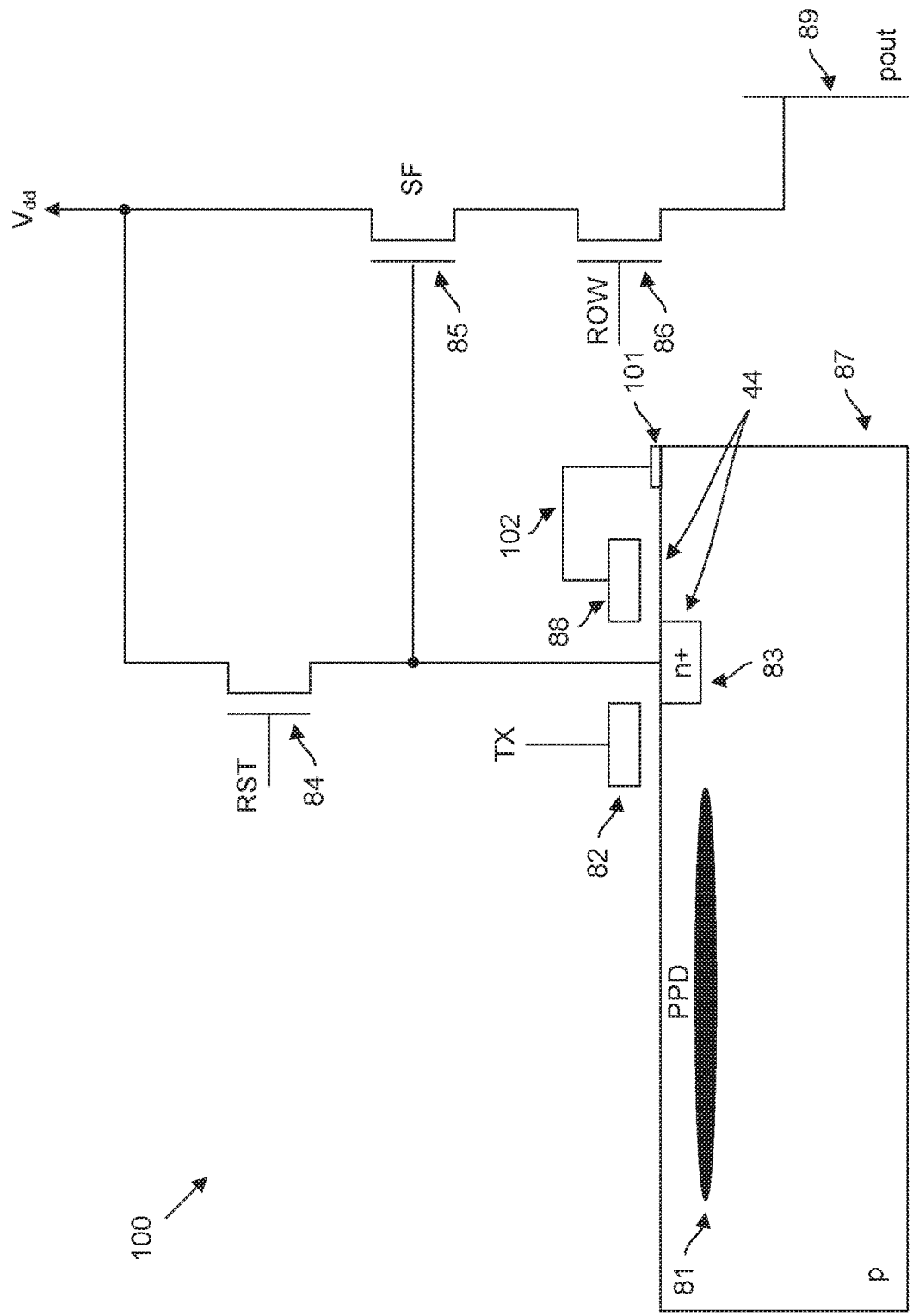
FIG. 10 shows an implementation of a pixel in accordance with an embodiment having a variable capacitance readout node including a MOSFET adjacent to a floating diffusion, where a gate of the MOSFET is grounded by a wire to a substrate contact.

FIG. 10 shows a pixel 100 in accordance with an embodiment that is similar to the pixel 80 of FIG. 8 except that the gate of the MOSFET 88 is grounded by a wire 102 to a substrate contact 101 rather than being connected to a reference voltage. In various embodiments, the MOSFET 88 is fabricated in depletion-mode to have a channel while the gate of the MOSFET 88 grounded. This allows for charge to be stored in the channel of the MOSFET 88 even while the gate of the MOSFET 88 is grounded. This technique of having a depletion-mode MOSFET with the gate grounded to the substrate contact 101 is attractive for small pixels where an additional bias line through the pixel for supplying a reference voltage to the MOSFET would otherwise be an issue. The readout node 44 includes the floating diffusion 83 and a channel of the MOSFET 88 adjacent to the floating diffusion 83.

FIG. 11A shows an implementation of a pixel 110 in accordance with an embodiment having a variable capacitance readout node 48 including a portion 47 of a barrier region 45 doped with a dopant adjacent to an n$^+$ floating diffusion 113. The pixel 110 includes a substrate 117, a photodiode 111, an anti-blooming gate 212, a transfer gate 112, the floating diffusion 113, a reset transistor 114, a drain 118, a drain 209, a source follower transistor (SF) 115, and a row select transistor 116. The pixel 110 further includes the barrier region 45 that has a first portion 46 and the second portion 47 that are both formed from a p$^+$ barrier layer, such as a layer of boron or BF2, in the substrate 117 and the second portion 47 of the barrier region 45 further has an n⁻ barrier channel that is formed from an n type dopant, such as arsenic. In various embodiments, the n⁻ barrier channel of the second portion 47 of the barrier region 45 has a portion that extends below the p⁺ barrier layer.

The region of the pinned photodiode 111 is formed by a p⁺ type doped implant 205 and an n type doped implant 206 where the potential well for the photodiode 111 is formed and photo-generated charge integrated. The photodiode 111 interfaces with the transfer gate 112, and a barrier implant 211 is located under a portion of the transfer gate 112. In various embodiments, the barrier implant 211 is a p⁺ type implant that forms a p⁺ barrier. The region of the pinned photodiode 111 also interfaces with a region of the anti-blooming gate 212 that further interfaces with the charge drain 209. The drain 209 includes an n⁺ type region and is connected to a power source to receive a supply voltage $V_{dd}$. The anti-blooming gate 212 is connected to receive an anti-blooming gate control signal (AB), and the anti-blooming gate 212 is controllable by the anti-blooming gate control signal AB.

The readout node 48 includes both the floating diffusion 113 and the second portion 47 of the barrier region 45, such that the floating diffusion 113 and the second portion 47 of the barrier region 45 together serve as the readout node 48 for the pixel 110. The photodiode 111 may be, for example, a pinned photodiode that collects charge during exposure based on the light intensity of a corresponding portion of a scene being imaged. The transfer gate 112 is connected to receive a transfer control signal (TX), and the transfer gate 112 is controllable by the transfer control signal TX. The floating diffusion 113 is located on an opposite side of the barrier region 45 from the transfer gate 112. The floating diffusion 113 can be filled with charge from the photodiode 111 based on the control of the transfer gate 112, and the charge passes through the barrier region 45 to get to the floating diffusion 113. The reset transistor 114, the source follower transistor 115, and the row select transistor 116 may each comprise, for example, an n-channel metal oxide semiconductor field effect transistor (NMOS transistor), or the like.

A gate of the reset transistor 114 is connected to receive a reset control signal (RST). The reset transistor 114 is located between the floating diffusion 113 and the drain 118. The drain 118 is connected to the power supply that provides the supply voltage $V_{dd}$. The reset transistor 114 is controllable by the reset control signal RST to reset the readout node 48 by providing a path to the drain 118. A gate of the source follower transistor 115 is connected to the floating diffusion 113. A first terminal of the source follower transistor 115 is connected to the power supply that supplies the supply voltage $V_{dd}$. A second terminal of the source follower transistor 115 is connected to a first terminal of the row select transistor 116. A gate of the row select transistor 116 is connected to receive a row select control signal (ROW). A second terminal of the row select transistor 116 is connected to a column readout line 119 for providing a pixel output signal (pout) for the pixel 110 on the column readout line 119. Thus, the pixel 110 is controlled with the control signals AB, TX, RST, and ROW, and the pixel 110 provides the pixel output signal pout.

In various embodiments, the second portion 47 of the barrier region 45 is located adjacent to the floating diffusion 113 in the pixel 110, and is configured such that after partial filling of the floating diffusion 113, charge starts filling an additional area in the second portion 47 of the barrier region 45. In various embodiments, the capacitance of the readout node 48 changes with a step change such as shown in FIG. 4B in accordance with a change in voltage at the readout node 48. Thus, the readout node 48, which includes the floating diffusion 113 and the second portion 47 of the barrier region 45 in the pixel 110, is configured to have a variable capacitance that is non-linear with respect to a voltage at the readout node 48.

FIG. 11B shows an associated potential diagram with a potential profile 300 for the pixel 110 of FIG. 11A with an illustration of potential wells including potential wells for the second portion 47 of the barrier region 45 and the floating diffusion 113. With reference to FIGS. 11A and 11B, a potential well 96 for the floating diffusion 113 and a potential well 97 for the second portion 47 of the barrier region 45 are shown. The potential well 96 is shown below the floating diffusion 113 and the potential well 97 is shown below the second portion 47 of the barrier region 45 for illustration purposes. A level of the potential well 96 of the floating diffusion 113 is set to a reset level 98 when the floating diffusion 113 is reset. During a transfer of charge from the photodiode 111, the charge will first pass through the barrier region 45 and fill into the potential well 96 of the floating diffusion 113 up to a certain level 99 that is the reset level of the potential well 97 of the second portion 47 of the barrier region 45, and then after reaching that level additional charge will fill into both the potential well 96 of the floating diffusion 113 and the potential well 97 of the second portion 47 of the barrier region 45. This allows for the capacitance of the readout node 48 that includes the floating diffusion 113 and the second portion 47 of the barrier region 45 to jump to a higher value once a certain amount of charge has been accumulated.

In various embodiments, the readout node 48 is configured to have a lower capacitance when reset to a reset voltage by the reset transistor 114 than when filled with charge from the photodiode 111. In various embodiments, the readout node 48 is configured such that the capacitance of the readout node 48 is a first capacitance when the readout node 48 is reset and such that the capacitance of the readout node 48 jumps from the first capacitance to a second capacitance that is higher than the first capacitance after the readout node 48 has been filled with a certain amount of charge. Also, in various embodiments, the readout node 48 is configured to have a first level of capacitance after being reset and to have a second level of capacitance after receiving a certain amount of charge.

In various embodiments, the second portion 47 of the barrier region 45 is located adjacent to the floating diffusion 113 and is configured to provide the potential well 97 with a different level than a level of the potential well 96 of the floating diffusion 113 when the floating diffusion 113 is reset. In various embodiments, the floating diffusion 113 and the second portion 47 of the barrier region 45 are configured to provide potential wells of different levels when the readout node 48 is reset, such as the potential wells 96 and 97.

The potential profile 300 includes a level 302 that corresponds to an anti-blooming drain bias of the charge drain 209. A level 303 is determined by a bias of the anti-blooming gate 212. As electrons 320 accumulate in a photodiode well 305 created in the photodiode 111, a level 306 determined by the electrons 320 in the photodiode 111 rises. The level 303 determined by the bias of the anti-blooming gate 212 sets the level at which the electrons 320 that have accumulated in the photodiode well 305 start to overflow into the charge drain 209 that is at the level 302, and such overflow of electrons 320 is illustrated by the arrow 321. Such overflow of the electrons 320 from the photodiode 111 into the charge drain 209 after the level 306 exceeds the level 303 determined by the bias of the anti-blooming gate 212 prevents charge from spilling into neighboring pixels when any particular pixel 110 is illuminated by a high intensity light source.

When it is necessary to reset the photodiode 111 by removing all charge from it, the anti-blooming gate 212 is biased high by controlling the anti-blooming gate control signal AB, resulting in the potential level under the anti-blooming gate 212 changing to level 301 from the level 303. When the potential level under the anti-blooming gate 212 is changed to level 301, the electrons 320 in the photodiode 111 then flow from the photodiode well 305 into the charge drain 209 at the level 302. After resetting the photodiode 111, the anti-blooming gate 212 is controlled by controlling the anti-blooming gate control signal AB to be a voltage that results in the potential level under the anti-blooming gate 212 changing back to level 303 from the level 301. Thus, the potential level under the anti-blooming gate 212 is controllable between the levels 303 and 301 by controlling the bias applied to the anti-blooming gate 212 by the anti-blooming gate control signal AB.

The photodiode well 305 that is the charge integration well of the photodiode 111 is bounded on one side by the anti-blooming barrier when the anti-blooming barrier is at the level 303, and the charge integration well of the photodiode 111 is bounded on the other side by a potential of a transfer gate barrier positioned at a level 310 that is created due to the barrier implant 211 when the transfer gate 112 is biased at a low biasing condition, or at a level 327 that is created due to the barrier implant 211 when the transfer gate 112 is biased at an intermediate biasing condition. In various embodiments, the biasing condition of the transfer gate 112 is controllable among the low biasing condition, the intermediate biasing condition, and a high biasing condition in accordance with a voltage level of the transfer gate control signal TX provided to the transfer gate 112. When a voltage is applied to the transfer gate 112 by the transfer gate control signal TX to bias the transfer gate 112, a potential well 326 is formed in the area 221 under the transfer gate 112. The level of the potential well 326 depends on the voltage applied to the transfer gate 112. Applying a voltage to the transfer gate 112 makes a depleted region in the area 221 under the transfer gate 112 that makes the potential well 326, and electrons are then attracted to the potential well 326 and accumulate there.

When the transfer gate 112 is biased high, the transfer gate barrier is lowered from the level 310 to a level 309, and electrons 322 from the photodiode well 305 flow (as illustrated by the arrow 323) into the potential well 326 under the transfer gate 112 that is at a potential level 308. Electrons 322 from the photodiode 111 then fill the potential well 326 under the transfer gate 112 to a level 313 and remain stored in the potential well 326 even after the bias of the transfer gate 112 is lowered to its starting intermediate biasing condition and the potential of the potential well 326 changes to a level that is a level 307 with a deviation from the level 307 due to any stored electrons. The electrons 322 are at that time confined in the potential well 326 under the transfer gate 112 by the transfer gate barrier at the level 327, and by a pinned barrier at a potential level 312. The transfer gate barrier at the level 327 is created due to the barrier implant 211 when the transfer gate 112 is biased in the intermediate biasing condition, and the pinned barrier at the level 312 is created due to the first portion 46 of the barrier region 45.

Charge is transferred from the potential well 326 under the transfer gate 112 to the readout node 48 over the first portion 46 of the barrier region 45 that is at the potential level 312 when the bias of the transfer gate 112 is lowered to its minimum biasing condition. That transfer gate bias change results in the potential of the potential well 326 under the transfer gate 112 being lowered to a level 311, which causes the electrons 322 to flow (as shown by the arrow 325) over the pinned charge transfer barrier at the level 312 to the readout node 48 that is a charge detection node. When the charge transfer from the potential well 326 under the transfer gate 112 is completed, the change at the readout node 48 is sensed by the source follower transistor 115.

An example operation of the pixel 110 in is now described. At the beginning of the operation cycle, the anti-blooming gate control signal AB applied to the anti-blooming gate 212 is controlled such that the potential level under the anti-blooming gate 212 changes to level 301, and all charge from the photodiode 111 is drained out into the charge drain 209 at the level 302. When an image capture is initiated for the pixel 110, the anti-blooming gate control signal AB is controlled such that the potential level under the anti-blooming gate 212 changes to level 303, and the transfer gate control signal TX is controlled to place the transfer gate 112 in the low biasing condition or in the intermediate biasing condition, such that the potential of the transfer gate barrier that is created due to the barrier implant 211 is either at the level 310 for the low biasing condition or the level 327 for the intermediate biasing condition. At that time, charge is collected during an exposure cycle in the photodiode 111. If the charge level in the photodiode 111 passes the level 303 set by the anti-blooming gate 212, then excess charge is skimmed from the photodiode 111 by overflowing into the charge drain 209 at the level 302.

The transfer of charge from the photodiode 111 to under the transfer gate 112 is then performed by controlling the transfer gate control signal TX to place the transfer gate 112 in the high biasing condition, such that the potential well 326 in the area 221 under the transfer gate 112 changes to the level 308, and the potential of the transfer gate barrier that is created due to the barrier implant 211 changes to the level 309. The charge from the photodiode 111 at that time is then transferred to the potential well 326 in the area 221 under the transfer gate 112.

After the transfer to the potential well 326 is completed, the transfer gate control signal TX is controlled to place the transfer gate 112 in the intermediate biasing condition, such that the potential of the transfer gate barrier that is created due to the barrier implant 211 is at the level 327 and the potential of the potential well 326 changes to a level that deviates from the level 307 depending on the amount of charge in the potential well 326. At that time, a new exposure cycle in the photodiode 111 can start, controlled by the anti-blooming gate control signal AB. The anti-blooming gate control signal AB can be controlled such that the potential level under the anti-blooming gate 212 changes to level 301 to cause charge to be drained from the photodiode 111, and then another exposure cycle starts by controlling the anti-blooming gate control signal AB such that the potential level under the anti-blooming gate 212 changes to level 303.

The readout of charge from the pixel 110 may be performed in parallel with the exposure cycle that collects charge for the subsequent readout. Prior to transferring charge to the variable capacitance readout node 48, the readout node 48 is cleared of all charge either with a reset pulse by controlling the reset control signal RST to the gate of the reset transistor 114 to be HIGH and then LOW, or the readout node 48 remains empty from a previous readout of charge from the readout node 48. When the readout node 48 is reset, the level of the potential well 96 of the floating diffusion 113 is set to the reset level 98. During a transfer of charge, the charge will first pass through the barrier region 45 and fill into the potential well 96 of the floating diffusion 113 up to a certain level 99 that is the reset level of the potential well 97 of the second portion 47 of the barrier region 45, and then after reaching that level additional charge will fill into both the potential well 96 of the floating diffusion 113 and the potential well 97 of the second portion 47 of the barrier region 45. This allows for the capacitance of the readout node 48 that includes the floating diffusion 113 and the second portion 47 of the barrier region 45 to jump to a higher value once a certain amount of charge has been accumulated. The transfer of charge from the potential well 326 under the transfer gate 112 to the readout node 48 is performed by controlling the transfer gate control signal TX applied to the transfer gate 112 such that the potential of the potential well 326 is changed to level 311 and all charge is transferred from the potential well 326 over the pinned barrier at the potential level 312 to the readout node 48.

The readout from the pixel 110 can start right after the transfer of charge from the potential well 326 to the readout node 48. To perform the readout from the pixel 110, the row select control signal ROW is controlled to be HIGH, and a pixel signal corresponding to the signal level of charge at the readout node 48 is read out over the column readout line 119. The row select control signal ROW is then controlled to be LOW, and the reset control signal RST is controlled to be HIGH to reset the readout node 48. The reset control signal RST is then controlled to be LOW and the row select control signal ROW is controlled to be HIGH to read out a potential (the reset value) of the empty readout node 48 over the column readout line 119.

The pixel signal corresponding to charge at the readout node 48 prior to reset and the reset value corresponding to the reset potential at the readout node 48 after the reset are provided to a corresponding column readout circuit for the column of the pixel array in which the pixel 110 is located. The column readout circuit digitizes a difference between the pixel signal and the signal of the reset potential to provide a digital output representing the charge collected by the pixel 110 during the corresponding exposure.

Thus, in various embodiments, the pixel 110 includes the transfer gate 112 that is controllable among at least three biasing conditions, including a first biasing condition in which electrons 322 are transferable from the photodiode 111 to the potential well 326 under the transfer gate 112, a second biasing condition in which the electrons 322 are confined in the potential well 326 under the transfer gate 112, and a third biasing condition in which the electrons 322 are transferable out of the potential well 326 under the transfer gate 112.

In various embodiments, the transfer gate 112 is controllable to be in the second biasing condition when a voltage of a particular voltage level is applied to the transfer gate 112 by the transfer gate control signal TX, and the transfer gate 112 is controllable to be in the first biasing condition when a voltage at a level higher than the particular voltage level is applied to the transfer gate 112 by the transfer gate control signal TX, and the transfer gate 112 is controllable to be in the third biasing condition when a voltage at a level lower than the particular voltage level is applied to the transfer gate 112 by the transfer gate control signal TX. In some embodiments, the transfer gate 112 is in the first biasing condition if a voltage of 3.3 V or higher is applied to the transfer gate 112 by the transfer gate control signal TX, the transfer gate 112 is in the second biasing condition if a voltage of 1 V is applied to the transfer gate 112 by the transfer gate control signal TX, and the transfer gate 112 is in the third biasing condition if a voltage of 0 V or lower is applied to the transfer gate 112 by the transfer gate control signal TX. Of course, those voltage values are merely provided as examples, and in various other embodiments, other suitable voltage levels can be used to control the transfer gate 112.

In some embodiments, the pixel 110 includes the barrier implant 211 that is a $p^+$ type implant located at least partially under a portion of the transfer gate 112, and the pixel 110 also includes a pinned charge transfer barrier located on an opposite side of the transfer gate 112 from the photodiode 111, where the pinned charge transfer barrier comprises the first portion 46 of the barrier region 45. In various embodiments, the barrier implant 211 is configured such that if the transfer gate 112 is controlled to be in the first biasing condition, a potential level of the transfer gate barrier provided by the barrier implant 211 is set, such as at the level 309, to allow the electrons 322 from the photodiode 111 to flow (as shown by the arrow 323) into the potential well 326 under the transfer gate 112.

In some embodiments, the barrier implant 211 and the first portion 46 of the barrier region 45 are configured such that if the transfer gate 112 is controlled to be in the second biasing condition, the electrons 322 are confinable in the potential well 326 under the transfer gate 112 due to a potential level of the transfer gate barrier provided by the barrier implant 211, which is at the level 327, and a potential level of the first portion 46 of the barrier region 45, which is at the level 312. Also, in some embodiments, the first portion 46 of the barrier region 45 is configured such that if the transfer gate 112 is controlled to be in the third biasing condition, a potential level of the first portion 46 of the barrier region 45, such as the level 312, allows the electrons 322 to be transferred (as shown by the arrow 325) from the potential well 326 under the transfer gate 112 to the readout node 48 that is on an opposite side of the first portion 46 of the barrier region 45 from the potential well 326 under the transfer gate 112.

Figure 12A:
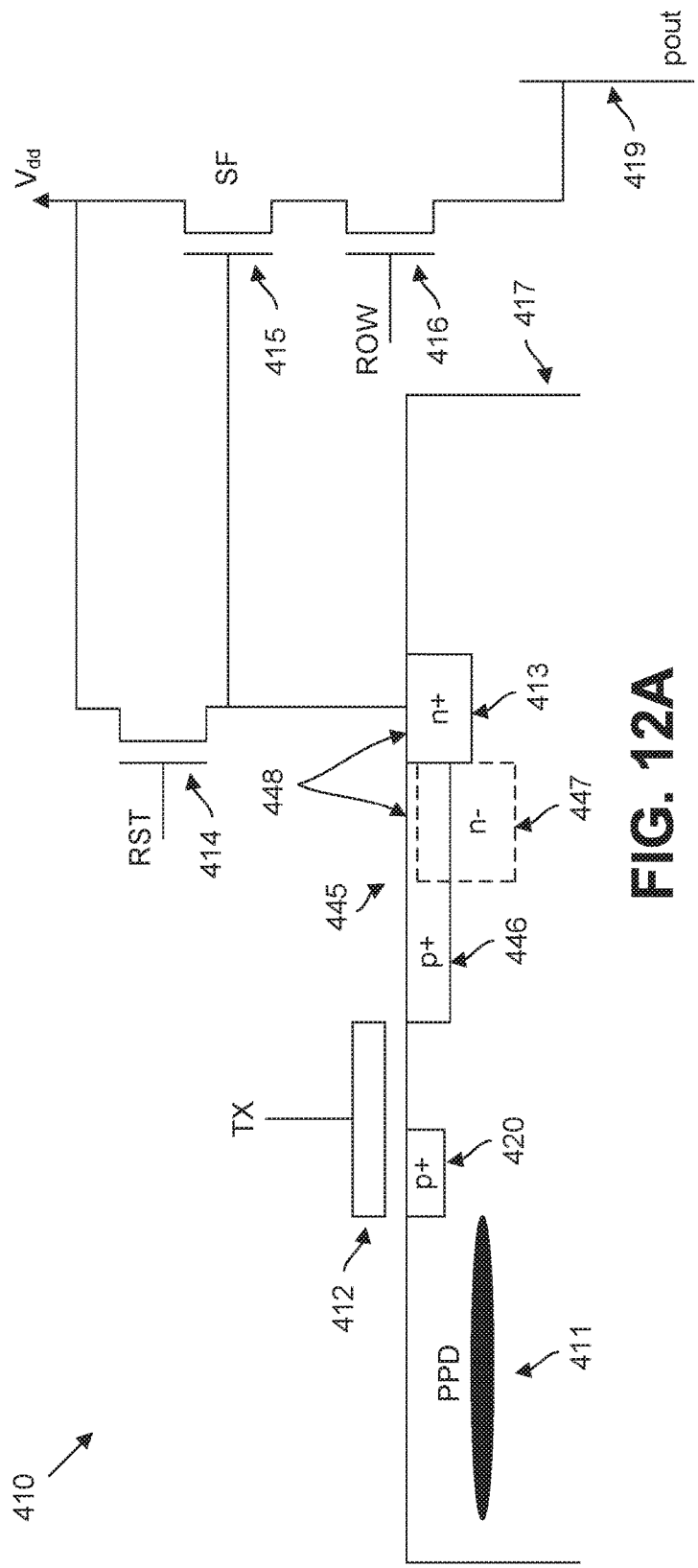
FIG. 12A shows an implementation of a pixel in accordance with an embodiment having a variable capacitance readout node.

FIG. 12A shows an implementation of a pixel 410 in accordance with an embodiment having a variable capacitance readout node 448 including a portion 447 of a barrier region 445 doped with a dopant adjacent to an $n^+$ floating diffusion 413. The pixel 410 includes a substrate 417, a photodiode 411, a transfer gate 412, a barrier implant 420, the floating diffusion 413, a reset transistor 414, a source follower transistor (SF) 415, and a row select transistor 416. The pixel 410 further includes the barrier region 445 that has a first portion 446 and the second portion 447 that are both formed from a $p^+$ barrier layer, such as a layer of boron or BF2, in the substrate 417 and the second portion 447 of the barrier region 445 further has an $n^-$ barrier channel that is formed from an n-type dopant, such as arsenic. In various embodiments, the $n^-$ barrier channel of the second portion 447 of the barrier region 445 has a portion that extends below the $p^+$ barrier layer. In various embodiments, the barrier implant 420 is a $p^+$ type implant, such as a boron or BF2 implant, that forms a $p^+$ barrier and is located at least partially under a portion of the transfer gate 412. In various embodiments, the barrier implant 420 is located adjacent to the photodiode 411.

The readout node 448 includes both the floating diffusion 413 and the second portion 447 of the barrier region 445, such that the floating diffusion 413 and the second portion 447 of the barrier region 445 together serve as the readout node 448 for the pixel 410. The photodiode 411 may be, for example, a pinned photodiode (PPD) that collects charge during exposure based on the light intensity of a corresponding portion of a scene being imaged. The transfer gate 412 is connected to receive a transfer control signal (TX), and the transfer gate 412 is controllable by the transfer control signal TX to transfer charge from the photodiode 411. The floating diffusion 413 is located on an opposite side of the barrier region 445 from the transfer gate 412. The floating diffusion 413 can be filled with charge from the photodiode 411 based on the control of the transfer gate 412, and the charge passes through the barrier region 445 to get to the floating diffusion 413. The reset transistor 414, the source follower transistor 415, and the row select transistor 416 may each comprise, for example, an n-channel metal oxide semiconductor field effect transistor (NMOS transistor), or the like. The barrier implant 420, which in various embodiments is a p⁺ barrier, prevents charge from spilling back into the photodiode 411 when charge is being transferred to the readout node 448.

A gate of the reset transistor 414 is connected to receive a reset control signal (RST). A first terminal of the reset transistor 414 is connected to the floating diffusion 413 and to a gate of the source follower transistor 415. A second terminal of the reset transistor 414 is connected to a power supply that supplies a supply voltage $V_{dd}$. The gate of the source follower transistor 415 is connected to the floating diffusion 413 and to the first terminal of the reset transistor 414. A first terminal of the source follower transistor 415 is connected to the power supply that supplies the supply voltage $V_{dd}$. A second terminal of the source follower transistor 415 is connected to a first terminal of the row select transistor 416. A gate of the row select transistor 416 is connected to receive a row select control signal (ROW). A second terminal of the row select transistor 416 is connected to a column readout line 419 for providing a pixel output signal (pout) for the pixel 410 on the column readout line 419. Thus, the pixel 410 is controlled with the control signals TX, RST, and ROW, and the pixel 410 provides the pixel output signal pout.

In various embodiments, the second portion 447 of the barrier region 445 is located adjacent to the floating diffusion 413 in the pixel 410, and is configured such that after partial filling of the floating diffusion 413, charge starts filling an additional area in the second portion 447 of the barrier region 445. In various embodiments, the capacitance of the readout node 448 changes with a step change such as shown in FIG. 4B in accordance with a change in voltage at the readout node 448. Thus, the readout node 448, which includes the floating diffusion 413 and the second portion 447 of the barrier region 445 in the pixel 410, is configured to have a variable capacitance that is non-linear with respect to a voltage at the readout node 448.

Figure 12B:
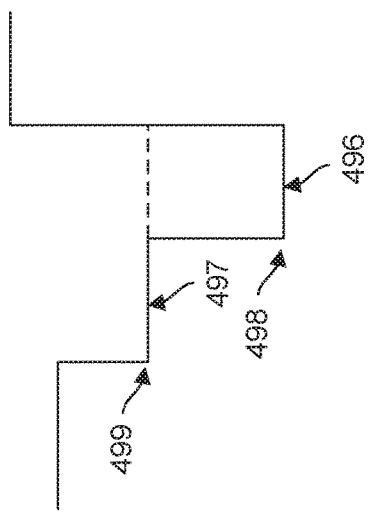
FIG. 12B shows an associated potential diagram for the pixel of FIG. 12A.

FIG. 12B shows an illustration of potential wells for the pixel 410 of FIG. 12A including potential wells for the second portion 447 of the barrier region 445 and the floating diffusion 413. A potential well 496 for the floating diffusion 413 and a potential well 497 for the second portion 447 of the barrier region 445 are shown. With reference to FIGS. 12A and 12B, the potential well 496 is shown below the floating diffusion 413 and the potential well 497 is shown below the second portion 447 of the barrier region 445 for illustration purposes. A level of the potential well 496 of the floating diffusion 413 is set to a reset level 498 when the floating diffusion 413 is reset. During a transfer of charge from the photodiode 411, the charge will first pass through the barrier region 445 and fill into the potential well 496 of the floating diffusion 413 up to a certain level 499 that is the reset level of the potential well 497 of the second portion 447 of the barrier region 445, and then after reaching that level additional charge will fill into both the potential well 496 of the floating diffusion 413 and the potential well 497 of the second portion 447 of the barrier region 445. This allows for the capacitance of the readout node 448 that includes the floating diffusion 413 and the second portion 447 of the barrier region 445 to jump to a higher value once a certain amount of charge has been accumulated.

In various embodiments, the readout node 448 is configured to have a lower capacitance when reset to a reset voltage by the reset transistor 414 than when filled with charge from the photodiode 411. In various embodiments, the readout node 448 is configured such that the capacitance of the readout node 448 is a first capacitance when the readout node 448 is reset and such that the capacitance of the readout node 448 jumps from the first capacitance to a second capacitance that is higher than the first capacitance after the readout node 448 has been filled with a certain amount of charge. Also, in various embodiments, the readout node 448 is configured to have a first level of capacitance after being reset and to have a second level of capacitance after receiving a certain amount of charge.

In various embodiments, the second portion 447 of the barrier region 445 is located adjacent to the floating diffusion 413 and is configured to provide the potential well 497 with a different level than a level of the potential well 496 of the floating diffusion 413 when the floating diffusion 413 is reset. In various embodiments, the floating diffusion 413 and the second portion 447 of the barrier region 445 are configured to provide potential wells of different levels when the readout node 448 is reset, such as the potential wells 496 and 497.

An operation of the pixel 410 in FIG. 12A during a shutter operation may proceed as follows: (i) the reset control signal RST is set HIGH and the transfer control signal TX is set HIGH to discharge the photodiode 411 and reset the readout node 448; (ii) the reset control signal RST is set LOW and the transfer control signal TX is set LOW to close the gate of the reset transistor 414 and the transfer gate 412 for an exposure time during which the photodiode 411 accumulates charge from sensed light, and the row select control signal ROW is set HIGH to read out a potential (the reset value) of the empty readout node 448 over the column readout line 419 and then the row select control signal ROW is set LOW; (iii) the transfer control signal TX is pulsed HIGH and then LOW such that during TX HIGH the charge is pulled from the photodiode 411 into under the transfer gate 412 and when TX is switched to LOW the charge is pushed from under the transfer gate 412 to the readout node 448 over the first portion 446 of the barrier region 445 located to the right side of the transfer gate 412 while the barrier implant 420 under a portion of the transfer gate 412 prevents charge from spilling back into the photodiode 411; and (iv) the row select control signal ROW is set HIGH to open the gate of the row select transistor 416 to provide output to the column readout line 419 that is representative of an amount of charge stored at the readout node 448.

FIG. 13A shows an implementation of a pixel 510 in accordance with an embodiment having a variable capacitance readout node 548 including a region 545 having a p⁺ buried channel 546 and an n⁻ barrier channel 547 adjacent to an n⁺ floating diffusion 513. The pixel 510 includes a substrate 517, a photodiode 511, a transfer gate 512, a barrier implant 520, the region 545, the floating diffusion 513, a reset transistor 514, a source follower transistor (SF) 515, and a row select transistor 516. The pixel 510 includes the region 545 that has the buried channel 546 formed from a p+ layer, such as a layer of boron or BF2, in the substrate 517 and the region 545 further has the n− barrier channel 547 that is formed from an n-type dopant, such as arsenic. In various embodiments, the n− barrier channel 547 of the region 545 overlaps the buried channel 546 and also has a portion that extends below the buried channel 546. In various embodiments, the barrier implant 520 is a p+ type implant, such as a boron or BF2 implant, that forms a p+ barrier and is located at least partially under a portion of the transfer gate 512. In various embodiments, the barrier implant 520 is located adjacent to the photodiode 511.

The readout node 548 includes both the floating diffusion 513 and the region 545, such that the floating diffusion 513 and the region 545 together serve as the readout node 548 for the pixel 510. The photodiode 511 may be, for example, a pinned photodiode (PPD) that collects charge during exposure based on the light intensity of a corresponding portion of a scene being imaged. The transfer gate 512 is connected to receive a transfer control signal (TX), and the transfer gate 512 is controllable by the transfer control signal TX to transfer charge from the photodiode 511. The floating diffusion 513 is located on an opposite side of the region 545 from the transfer gate 512. The floating diffusion 513 can be filled with charge from the photodiode 511 based on the control of the transfer gate 512. The reset transistor 514, the source follower transistor 515, and the row select transistor 516 may each comprise, for example, an n-channel metal oxide semiconductor field effect transistor (NMOS transistor), or the like. The barrier implant 520, which in various embodiments is a p+ barrier, prevents charge from spilling back into the photodiode 511 when charge is being transferred to the readout node 548.

A gate of the reset transistor 514 is connected to receive a reset control signal (RST). A first terminal of the reset transistor 514 is connected to the floating diffusion 513 and to a gate of the source follower transistor 515. A second terminal of the reset transistor 514 is connected to a power supply that supplies a supply voltage $V_{dd}$. The gate of the source follower transistor 515 is connected to the floating diffusion 513 and to the first terminal of the reset transistor 514. A first terminal of the source follower transistor 515 is connected to the power supply that supplies the supply voltage $V_{dd}$. A second terminal of the source follower transistor 515 is connected to a first terminal of the row select transistor 516. A gate of the row select transistor 516 is connected to receive a row select control signal (ROW). A second terminal of the row select transistor 516 is connected to a column readout line 519 for providing a pixel output signal (pout) for the pixel 510 on the column readout line 519. Thus, the pixel 510 is controlled with the control signals TX, RST, and ROW, and the pixel 510 provides the pixel output signal pout.

In various embodiments, the region 545 is located adjacent to the floating diffusion 513 in the pixel 510, and is configured such that after partial filling of the floating diffusion 513, charge starts filling an additional area in the region 545. In various embodiments, the capacitance of the readout node 548 changes with a step change such as shown in FIG. 4B in accordance with a change in voltage at the readout node 548. Thus, the readout node 548, which includes the floating diffusion 513 and the region 545 in the pixel 510, is configured to have a variable capacitance that is non-linear with respect to a voltage at the readout node 548.

FIG. 13B shows an illustration of potential wells for the pixel 510 of FIG. 13A including potential wells for the region 545 and the floating diffusion 513. A potential well 596 for the floating diffusion 513 and a potential well 597 for the region 545 are shown. With reference to FIGS. 13A and 13B, the potential well 596 is shown below the floating diffusion 513 and the potential well 597 is shown below the region 545 for illustration purposes. A level of the potential well 596 of the floating diffusion 513 is set to a reset level 598 when the floating diffusion 513 is reset. During a transfer of charge from the photodiode 511, the charge will first pass through the region 545 and fill into the potential well 596 of the floating diffusion 513 up to a certain level 599 that is the reset level of the potential well 597 of the region 545, and then after reaching that level additional charge will fill into both the potential well 596 of the floating diffusion 513 and the potential well 597 of the region 545. This allows for the capacitance of the readout node 548 that includes the floating diffusion 513 and the region 545 to jump to a higher value once a certain amount of charge has been accumulated.

In various embodiments, the readout node 548 is configured to have a lower capacitance when reset to a reset voltage by the reset transistor 514 than when filled with charge from the photodiode 511. In various embodiments, the readout node 548 is configured such that the capacitance of the readout node 548 is a first capacitance when the readout node 548 is reset and such that the capacitance of the readout node 548 jumps from the first capacitance to a second capacitance that is higher than the first capacitance after the readout node 548 has been filled with a certain amount of charge. Also, in various embodiments, the readout node 548 is configured to have a first level of capacitance after being reset and to have a second level of capacitance after receiving a certain amount of charge.

In various embodiments, the region 545 is located adjacent to the floating diffusion 513 and is configured to provide the potential well 597 with a different level than a level of the potential well 596 of the floating diffusion 513 when the floating diffusion 513 is reset. In various embodiments, the floating diffusion 513 and the region 545 are configured to provide potential wells of different levels when the readout node 548 is reset, such as the potential wells 596 and 597.

An operation of the pixel 510 in FIG. 13A during a shutter operation may proceed as follows: (i) the reset control signal RST is set HIGH and the transfer control signal TX is set HIGH to discharge the photodiode 511 and reset the readout node 548; (ii) the reset control signal RST is set LOW and the transfer control signal TX is set LOW to close the gate of the reset transistor 514 and the transfer gate 512 for an exposure time during which the photodiode 511 accumulates charge from sensed light, and the row select control signal ROW is set HIGH to read out a potential (the reset value) of the empty readout node 548 over the column readout line 519 and then the row select control signal ROW is set LOW; (iii) the transfer control signal TX is pulsed HIGH and then LOW such that during TX HIGH the charge is transferred from the photodiode 511 to under the transfer gate 512 and partially to the readout node 548 and when TX is switched to LOW the charge remaining under the transfer gate 512 is pushed from under the transfer gate 512 to the readout node 548 while the barrier implant 520 under a portion of the transfer gate 512 prevents charge from spilling back into the photodiode 511; and (iv) the row select control signal ROW is set HIGH to open the gate of the row select transistor 516 to provide output to the column readout line 519 that is representative of an amount of charge stored at the readout node 548.

Figure 14A:
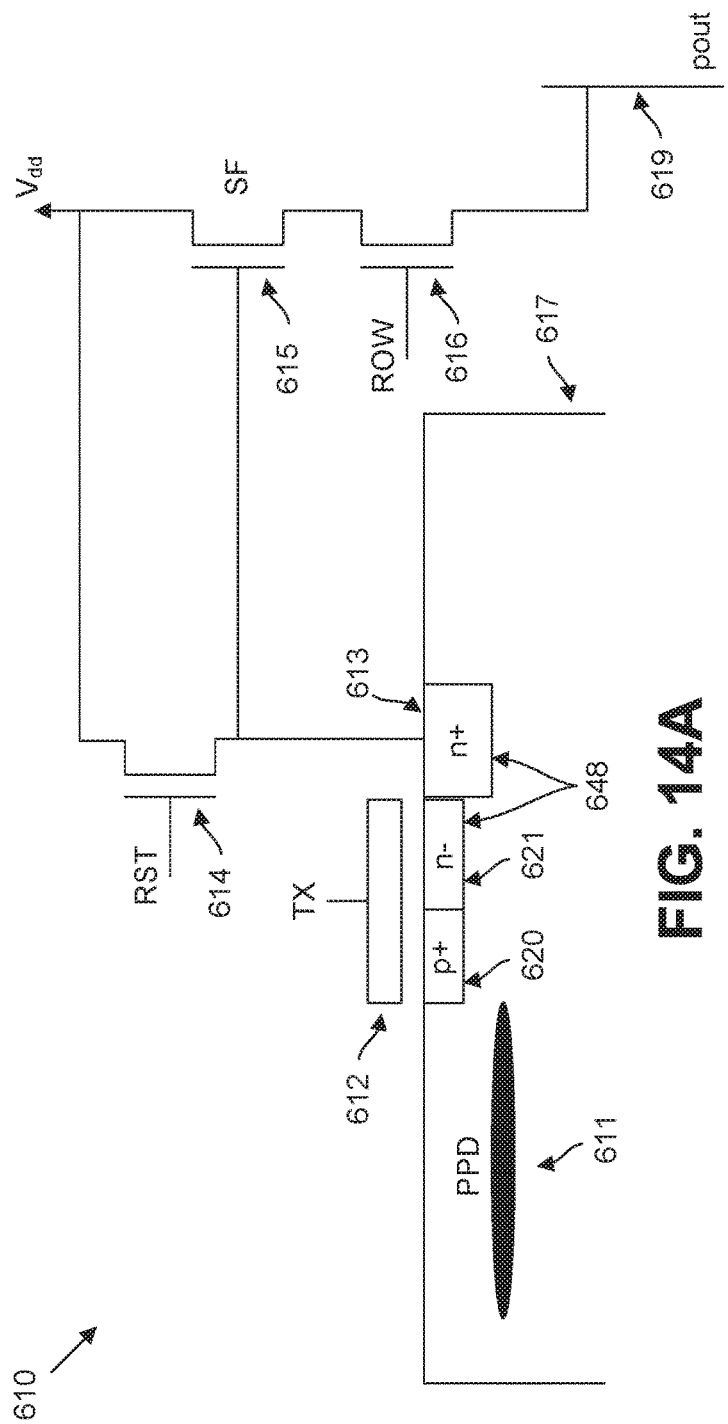
FIG. 14A shows an implementation of a pixel in accordance with an embodiment having a variable capacitance readout node.

FIG. 14A shows an implementation of a pixel 610 in accordance with an embodiment having a variable capacitance readout node 648 including an n+ floating diffusion 613 and a portion 621 of a channel under a transfer gate 612 adjacent to the floating diffusion 613. The pixel 610 includes a substrate 617, a photodiode 611, the transfer gate 612, a barrier implant 620, the portion 621 of the channel under the transfer gate 612, the floating diffusion 613, a reset transistor 614, a source follower transistor (SF) 615, and a row select transistor 616. In various embodiments, the portion 621 of the channel under the transfer gate 612 has an n− area that is formed from an n-type dopant, such as arsenic. In various embodiments, the barrier implant 620 is a p+ type implant, such as a boron or BF2 implant, that forms a p+ barrier and is located at least partially under a portion of the transfer gate 612. In various embodiments, the barrier implant 620 is located adjacent to the photodiode 611.

The readout node 648 includes both the floating diffusion 613 and the portion 621 of the channel under the transfer gate 612, such that the floating diffusion 613 and the portion 621 of the channel under the transfer gate 612 together serve as the readout node 648 for the pixel 610. The photodiode 611 may be, for example, a pinned photodiode (PPD) that collects charge during exposure based on the light intensity of a corresponding portion of a scene being imaged. The transfer gate 612 is connected to receive the transfer control signal TX, and the transfer gate 612 is controllable by the transfer control signal TX to transfer charge from the photodiode 611. The floating diffusion 613 can be filled with charge from the photodiode 611 based on the control of the transfer gate 612. The reset transistor 614, the source follower transistor 615, and the row select transistor 616 may each comprise, for example, an n-channel metal oxide semiconductor field effect transistor (NMOS transistor), or the like. The barrier implant 620, which in various embodiments is a p+ barrier, prevents charge from spilling back into the photodiode 611 when charge is being transferred to the readout node 648.

A gate of the reset transistor 614 is connected to receive a reset control signal (RST). A first terminal of the reset transistor 614 is connected to the floating diffusion 613 and to a gate of the source follower transistor 615. A second terminal of the reset transistor 614 is connected to a power supply that supplies a supply voltage $V_{dd}$. The gate of the source follower transistor 615 is connected to the floating diffusion 613 and to the first terminal of the reset transistor 614. A first terminal of the source follower transistor 615 is connected to the power supply that supplies the supply voltage $V_{dd}$. A second terminal of the source follower transistor 615 is connected to a first terminal of the row select transistor 616. A gate of the row select transistor 616 is connected to receive a row select control signal (ROW). A second terminal of the row select transistor 616 is connected to a column readout line 619 for providing a pixel output signal (pout) for the pixel 610 on the column readout line 619. Thus, the pixel 610 is controlled with the control signals TX, RST, and ROW, and the pixel 610 provides the pixel output signal pout.

In various embodiments, the portion 621 of the channel under the transfer gate 612 is located adjacent to the floating diffusion 613 in the pixel 610, and is configured such that after partial filling of the floating diffusion 613, charge starts filling an additional area in the portion 621 of the channel under the transfer gate 612. In various embodiments, the capacitance of the readout node 648 changes with a step change such as shown in FIG. 4B in accordance with a change in voltage at the readout node 648. Thus, the readout node 648, which includes the floating diffusion 613 and the portion 621 of the channel under the transfer gate 612 in the pixel 610, is configured to have a variable capacitance that is non-linear with respect to a voltage at the readout node 648.

Figure 14B:
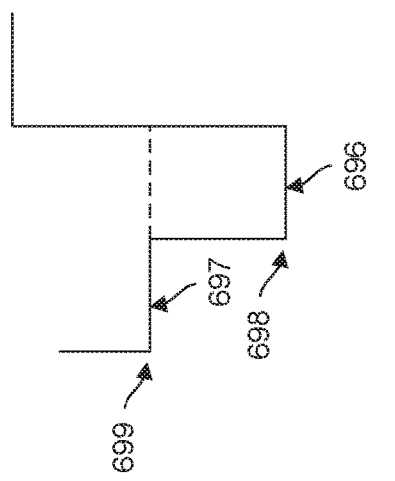
FIG. 14B shows an associated potential diagram for the pixel of FIG. 14A.

FIG. 14B shows an illustration of potential wells for the pixel 610 of FIG. 14A including potential wells for the floating diffusion 613 and the portion 621 of the channel under the transfer gate 612. A potential well 696 for the floating diffusion 613 and a potential well 697 for the portion 621 of the channel under the transfer gate 612 are shown. With reference to FIGS. 14A and 14B, the potential well 696 is shown below the floating diffusion 613 and the potential well 697 is shown below the portion 621 of the channel under the transfer gate 612 for illustration purposes. A level of the potential well 696 of the floating diffusion 613 is set to a reset level 698 when the floating diffusion 613 is reset. During a transfer of charge from the photodiode 611, the charge will first pass through the portion 621 of the channel under the transfer gate 612 and fill into the potential well 696 of the floating diffusion 613 up to a certain level 699 that is the reset level of the potential well 697 of the portion 621 of the channel under the transfer gate 612, and then after reaching that level additional charge will fill into both the potential well 696 of the floating diffusion 613 and the potential well 697 of the portion 621 of the channel under the transfer gate 612. This allows for the capacitance of the readout node 648 that includes the floating diffusion 613 and the portion 621 of the channel under the transfer gate 612 to jump to a higher value once a certain amount of charge has been accumulated.

In various embodiments, the readout node 648 is configured to have a lower capacitance when reset to a reset voltage by the reset transistor 614 than when filled with charge from the photodiode 611. In various embodiments, the readout node 648 is configured such that the capacitance of the readout node 648 is a first capacitance when the readout node 648 is reset and such that the capacitance of the readout node 648 jumps from the first capacitance to a second capacitance that is higher than the first capacitance after the readout node 648 has been filled with a certain amount of charge. Also, in various embodiments, the readout node 648 is configured to have a first level of capacitance after being reset and to have a second level of capacitance after receiving a certain amount of charge.

In various embodiments, the portion 621 of the channel under the transfer gate 612 is located adjacent to the floating diffusion 613 and is configured to provide the potential well 697 with a different level than a level of the potential well 696 of the floating diffusion 613 when the floating diffusion 613 is reset. In various embodiments, the floating diffusion 613 and the portion 621 of the channel under the transfer gate 612 are configured to provide potential wells of different levels when the readout node 648 is reset, such as the potential wells 696 and 697.

An operation of the pixel 610 in FIG. 14A during a shutter operation may proceed as follows: (i) the reset control signal RST is set HIGH and the transfer control signal TX is set HIGH to discharge the photodiode 611 and reset the readout node 648; (ii) the reset control signal RST is set LOW and the transfer control signal TX is set LOW to close the gate of the reset transistor 614 and the transfer gate 612 for an exposure time during which the photodiode 611 accumulates charge from sensed light, and the row select control signal ROW is set HIGH to read out a potential (the reset value) of the empty readout node 648 over the column readout line 619 and then the row select control signal ROW is set LOW;

(iii) the transfer control signal TX is set HIGH and by doing so the charge from the photodiode 611 is transferred into both the portion 621 of the channel under the transfer gate 612 and the floating diffusion 613; (iv) the transfer control signal TX is set LOW to finish the charge transfer, which causes the charge to fill the floating diffusion 613 and part of the charge remains in the portion 621 of the channel under the transfer gate 612 such that a dual-capacity response is achieved while the barrier implant 620 under a portion of the transfer gate 612 prevents charge from spilling back into the photodiode 611; and (v) the row select control signal ROW is set HIGH to open the gate of the row select transistor 616 to provide output to the column readout line 619 that is representative of an amount of charge stored at the readout node 648.

There are various embodiments for implementing the storage area for the portion 621 of the channel under the transfer gate 612. In some embodiments, arsenic is implanted in the portion 621 of the channel under the transfer gate 612 to make an n− area turning that side of the transfer gate 612 into an accumulation-mode metal-oxide-semiconductor field-effect transistor (MOSFET) that has a storage channel at that portion 621 of the channel under the transfer gate 612 even when the transfer control signal TX is grounded. Thus, with an n− implant, the transfer gate 612 can be grounded with 0 V applied as the transfer control signal TX and there is still a built in channel for that portion 621 of the channel under the transfer gate 612. In some embodiments, a native MOSFET can be used without any implant for the portion 621 of the channel under the transfer gate 612. In some embodiments, there is no implant for the portion 621 of the channel under the transfer gate 612, and a small voltage such as 0.5 V is applied as the transfer control signal TX to allow for storing charge in the portion 621 of the channel under the transfer gate 612.

Figure 15A:
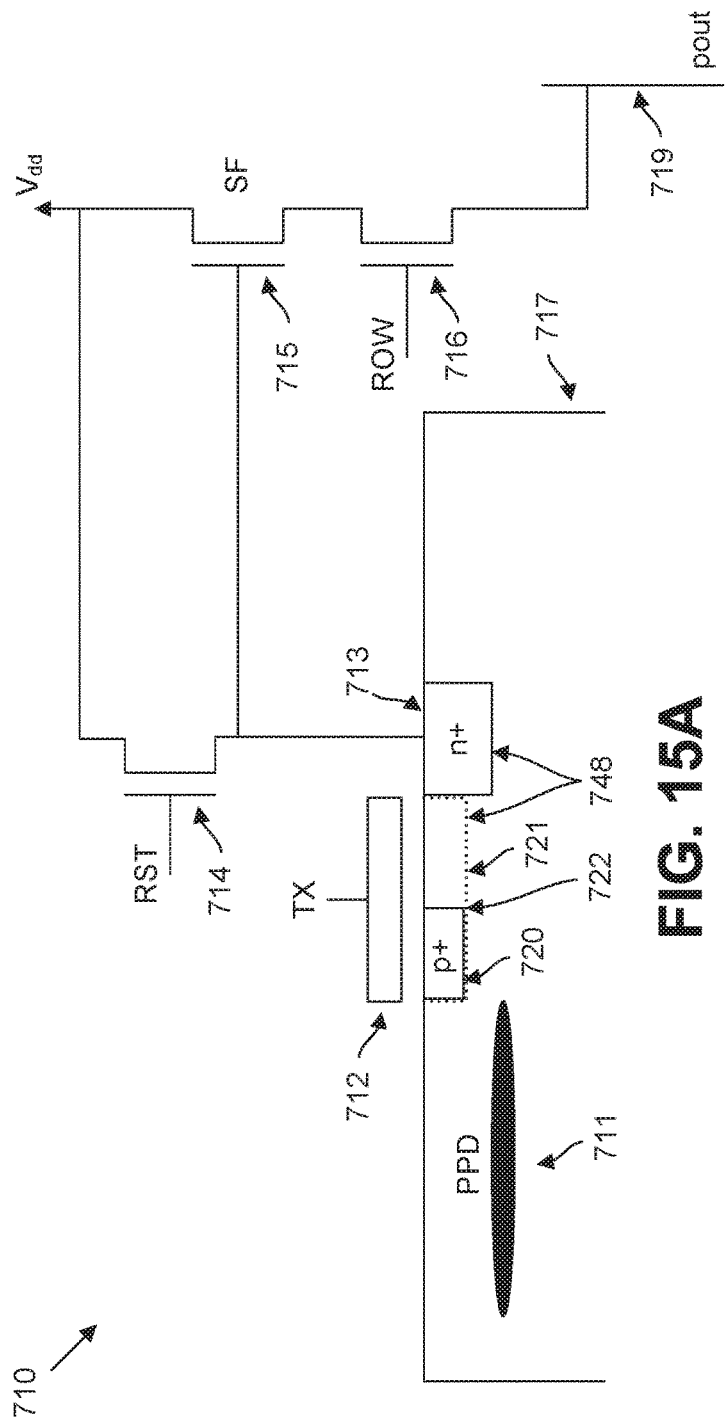
FIG. 15A shows an implementation of a pixel in accordance with an embodiment having a variable capacitance readout node.

FIG. 15A shows an implementation of a pixel 710 in accordance with an embodiment having a variable capacitance readout node 748 including an n+ floating diffusion 713 and a portion 721 of a channel 722 under a transfer gate 712 adjacent to the floating diffusion 713. The pixel 710 includes a substrate 717, a photodiode 711, the transfer gate 712, the channel 722, a barrier implant 720 in a portion of the channel 722, the floating diffusion 713, a reset transistor 714, a source follower transistor (SF) 715, and a row select transistor 716.

In various embodiments, the channel 722 is a channel of a metal oxide semiconductor field effect transistor (MOSFET), where the MOSFET includes the transfer gate 712. In various embodiments, the transfer gate 712 does not have any threshold adjust implant. In various embodiments, the channel 722 is made as a channel for a native MOSFET, such that the MOSFET does not have any threshold adjust implant that would adjust a threshold voltage, and the barrier implant 720 is located in a portion of the channel 722. In electronics, a native transistor is a type of MOSFET that is intermediate between enhancement and depletion modes. A native MOSFET is a transistor with nearly zero threshold voltage. In various embodiments, the portion 721 of the channel 722 located between the barrier implant 720 and the floating diffusion 713 is made as for a native MOSFET without any threshold adjust implant. In various embodiments, the barrier implant 720 is a p+ type implant, such as a boron or BF2 implant, that forms a p+ barrier and is located at least partially under a portion of the transfer gate 712. In various embodiments, the barrier implant 720 is located adjacent to the photodiode 711.

The readout node 748 includes both the floating diffusion 713 and the portion 721 of the channel 722 under the transfer gate 712 and between the barrier implant 720 and the floating diffusion 713, such that the floating diffusion 713 and the portion 721 of the channel 722 together serve as the readout node 748 for the pixel 710. The photodiode 711 may be, for example, a pinned photodiode (PPD) that collects charge during exposure based on the light intensity of a corresponding portion of a scene being imaged. The transfer gate 712 is connected to receive the transfer control signal TX, and the transfer gate 712 is controllable by the transfer control signal TX to transfer charge from the photodiode 711. The floating diffusion 713 can be filled with charge from the photodiode 711 based on the control of the transfer gate 712. The reset transistor 714, the source follower transistor 715, and the row select transistor 716 may each comprise, for example, an n-channel metal oxide semiconductor field effect transistor (NMOS transistor), or the like. The barrier implant 720 prevents charge from spilling back into the photodiode 711 when charge is being transferred to the readout node 748.

A gate of the reset transistor 714 is connected to receive a reset control signal (RST). A first terminal of the reset transistor 714 is connected to the floating diffusion 713 and to a gate of the source follower transistor 715. A second terminal of the reset transistor 714 is connected to a power supply that supplies a supply voltage $V_{dd}$. The gate of the source follower transistor 715 is connected to the floating diffusion 713 and to the first terminal of the reset transistor 714. A first terminal of the source follower transistor 715 is connected to the power supply that supplies the supply voltage $V_{dd}$. A second terminal of the source follower transistor 715 is connected to a first terminal of the row select transistor 716. A gate of the row select transistor 716 is connected to receive a row select control signal (ROW). A second terminal of the row select transistor 716 is connected to a column readout line 719 for providing a pixel output signal (pout) for the pixel 710 on the column readout line 719. Thus, the pixel 710 is controlled with the control signals TX, RST, and ROW, and the pixel 710 provides the pixel output signal pout.

In various embodiments, the portion 721 of the channel 722 under the transfer gate 712 is located adjacent to the floating diffusion 713 in the pixel 710, and is configured such that after partial filling of the floating diffusion 713, charge starts filling an additional area in the portion 721 of the channel 722 under the transfer gate 712 and between the barrier implant 720 and the floating diffusion 713. In various embodiments, the capacitance of the readout node 748 changes with a step change such as shown in FIG. 4B in accordance with a change in voltage at the readout node 748. Thus, the readout node 748, which includes the floating diffusion 713 and the portion 721 of the channel 722 under the transfer gate 712 and between the barrier implant 720 and the floating diffusion 713 in the pixel 710, is configured to have a variable capacitance that is non-linear with respect to a voltage at the readout node 748.

Figure 15B:
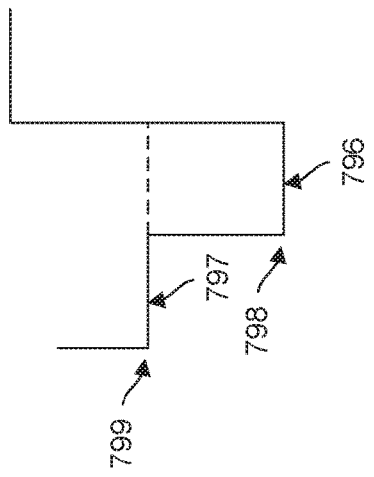
FIG. 15B shows an associated potential diagram for the pixel of FIG. 15A.

FIG. 15B shows an illustration of potential wells for the pixel 710 of FIG. 15A including potential wells for the floating diffusion 713 and the portion 721 of the channel 722 under the transfer gate 712 and between the barrier implant 720 and the floating diffusion 713. A potential well 796 for the floating diffusion 713 and a potential well 797 for the portion 721 of the channel 722 under the transfer gate 712 and between the barrier implant 720 and the floating diffusion 713 are shown. With reference to FIGS. 15A and 15B, the potential well 796 is shown below the floating diffusion 713 and the potential well 797 is shown below the portion 721 of the channel 722 for illustration purposes. A level of the potential well 796 of the floating diffusion 713 is set to a reset level 798 when the floating diffusion 713 is reset. During a transfer of charge from the photodiode 711, the charge will first pass through the portion 721 of the channel 722 and fill into the potential well 796 of the floating diffusion 713 up to a certain level 799 that is the reset level of the potential well 797 of the portion 721 of the channel 722, and then after reaching that level additional charge will fill into both the potential well 796 of the floating diffusion 713 and the potential well 797 of the portion 721 of the channel 722. This allows for the capacitance of the readout node 748 that includes the floating diffusion 713 and the portion 721 of the channel 722 to jump to a higher value once a certain amount of charge has been accumulated.

In various embodiments, the readout node 748 is configured to have a lower capacitance when reset to a reset voltage by the reset transistor 714 than when filled with charge from the photodiode 711. In various embodiments, the readout node 748 is configured such that the capacitance of the readout node 748 is a first capacitance when the readout node 748 is reset and such that the capacitance of the readout node 748 jumps from the first capacitance to a second capacitance that is higher than the first capacitance after the readout node 748 has been filled with a certain amount of charge. Also, in various embodiments, the readout node 748 is configured to have a first level of capacitance after being reset and to have a second level of capacitance after receiving a certain amount of charge.

In various embodiments, the portion 721 of the channel 722 under the transfer gate 712 is located adjacent to the floating diffusion 713 and is configured to provide the potential well 797 with a different level than a level of the potential well 796 of the floating diffusion 713 when the floating diffusion 713 is reset. In various embodiments, the floating diffusion 713 and the portion 721 of the channel 722 are configured to provide potential wells of different levels when the readout node 748 is reset, such as the potential wells 796 and 797.

Figure 16A:
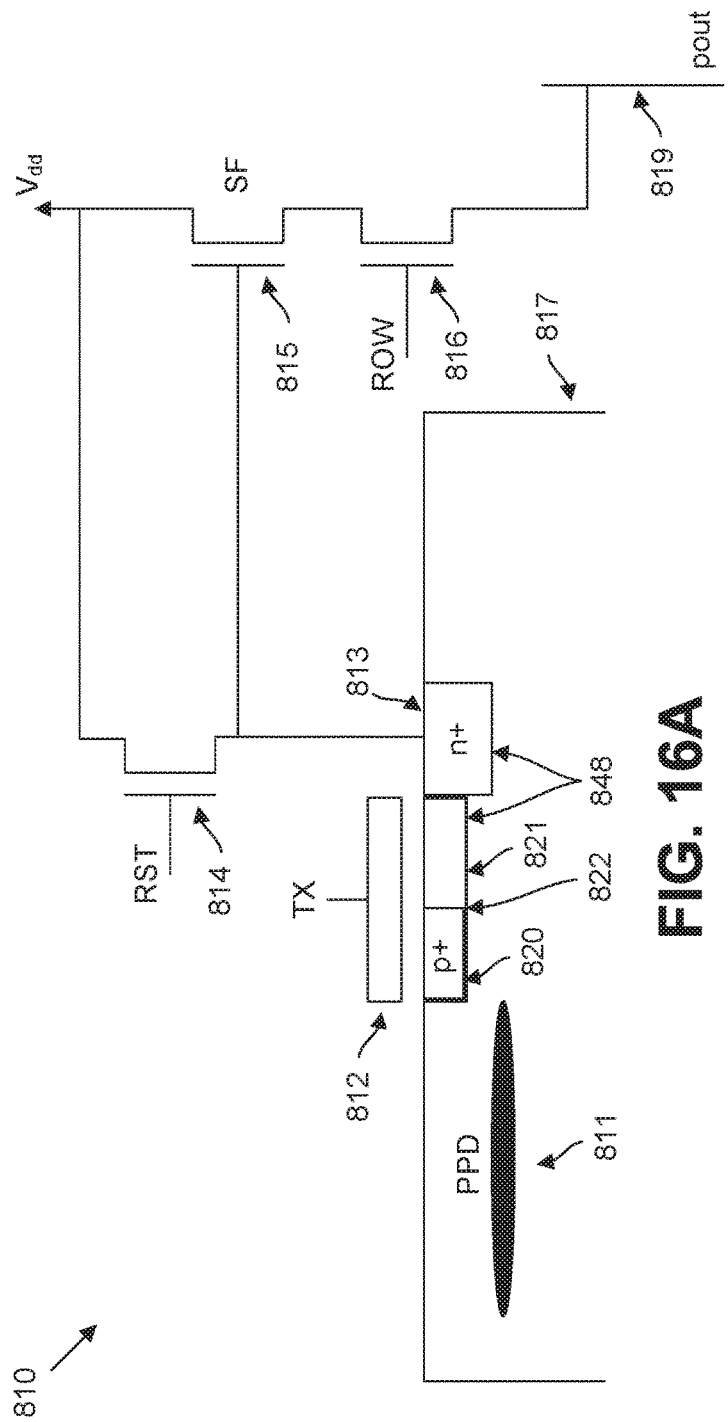
FIG. 16A shows an implementation of a pixel in accordance with an embodiment having a variable capacitance readout node.

FIG. 16A shows an implementation of a pixel 810 in accordance with an embodiment having a variable capacitance readout node 848 including an n+ floating diffusion 813 and a portion 821 of a channel 822 under a transfer gate 812 adjacent to the floating diffusion 813. The pixel 810 includes a substrate 817, a photodiode 811, the transfer gate 812, the channel 822, a barrier implant 820 in a portion of the channel 822, the floating diffusion 813, a reset transistor 814, a source follower transistor (SF) 815, and a row select transistor 816.

The channel 822 is a channel of a metal oxide semiconductor field effect transistor (MOSFET), where the MOSFET includes the transfer gate 812. In various embodiments, the transfer gate 812 includes a threshold adjust implant. In various embodiments, the channel 822 is made with an n-channel MOSFET (NMOS) threshold adjust implant. For example, in some embodiments, the channel 822 is doped with BF2 as a threshold adjust implant to bring its threshold voltage level to 0.4 V. In various embodiments, the barrier implant 820 is located in a portion of the channel 822. In various embodiments, the portion 821 of the channel 822 located between the barrier implant 820 and the floating diffusion 813 is made with an NMOS threshold adjust implant. In various embodiments, the barrier implant 820 is a p+ type implant, such as a boron or BF2 implant, that forms a p+ barrier and is located at least partially under a portion of the transfer gate 812. In various embodiments, the barrier implant 820 is located adjacent to the photodiode 811.

The readout node 848 includes both the floating diffusion 813 and the portion 821 of the channel 822 under the transfer gate 812 and between the barrier implant 820 and the floating diffusion 813, such that the floating diffusion 813 and the portion 821 of the channel 822 together serve as the readout node 848 for the pixel 810. The photodiode 811 may be, for example, a pinned photodiode (PPD) that collects charge during exposure based on the light intensity of a corresponding portion of a scene being imaged. The transfer gate 812 is connected to receive the transfer control signal TX, and the transfer gate 812 is controllable by the transfer control signal TX to transfer charge from the photodiode 811. The floating diffusion 813 can be filled with charge from the photodiode 811 based on the control of the transfer gate 812. The reset transistor 814, the source follower transistor 815, and the row select transistor 816 may each comprise, for example, an n-channel metal oxide semiconductor field effect transistor (NMOS transistor), or the like. The barrier implant 820 prevents charge from spilling back into the photodiode 811 when charge is being transferred to the readout node 848.

A gate of the reset transistor 814 is connected to receive a reset control signal (RST). A first terminal of the reset transistor 814 is connected to the floating diffusion 813 and to a gate of the source follower transistor 815. A second terminal of the reset transistor 814 is connected to a power supply that supplies a supply voltage $V_{dd}$. The gate of the source follower transistor 815 is connected to the floating diffusion 813 and to the first terminal of the reset transistor 814. A first terminal of the source follower transistor 815 is connected to the power supply that supplies the supply voltage $V_{dd}$. A second terminal of the source follower transistor 815 is connected to a first terminal of the row select transistor 816. A gate of the row select transistor 816 is connected to receive a row select control signal (ROW). A second terminal of the row select transistor 816 is connected to a column readout line 819 for providing a pixel output signal (pout) for the pixel 810 on the column readout line 819. Thus, the pixel 810 is controlled with the control signals TX, RST, and ROW, and the pixel 810 provides the pixel output signal pout.

In various embodiments, the portion 821 of the channel 822 under the transfer gate 812 is located adjacent to the floating diffusion 813 in the pixel 810, and is configured such that after partial filling of the floating diffusion 813, charge starts filling an additional area in the portion 821 of the channel 822 under the transfer gate 812 and between the barrier implant 820 and the floating diffusion 813. In various embodiments, the capacitance of the readout node 848 changes with a step change such as shown in FIG. 4B in accordance with a change in voltage at the readout node 848. Thus, the readout node 848, which includes the floating diffusion 813 and the portion 821 of the channel 822 under the transfer gate 812 and between the barrier implant 820 and the floating diffusion 813 in the pixel 810, is configured to have a variable capacitance that is non-linear with respect to a voltage at the readout node 848.

Figure 16B:
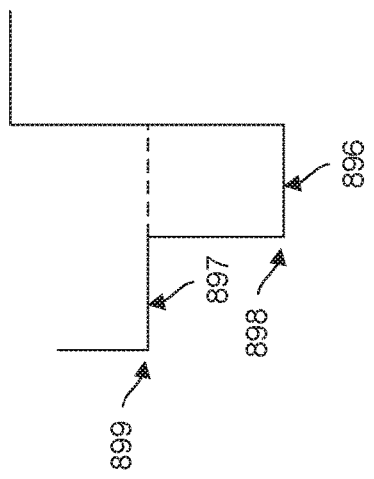
FIG. 16B shows an associated potential diagram for the pixel of FIG. 16A.

FIG. 16B shows an illustration of potential wells for the pixel 810 of FIG. 16A including potential wells for the floating diffusion 813 and the portion 821 of the channel 822 under the transfer gate 812 and between the barrier implant 820 and the floating diffusion 813. A potential well 896 for the floating diffusion 813 and a potential well 897 for the portion 821 of the channel 822 under the transfer gate 812 and between the barrier implant 820 and the floating diffusion 813 are shown. With reference to FIGS. 16A and 16B, the potential well 896 is shown below the floating diffusion 813 and the potential well 897 is shown below the portion 821 of the channel 822 for illustration purposes. A level of the potential well 896 of the floating diffusion 813 is set to a reset level 898 when the floating diffusion 813 is reset. During a transfer of charge from the photodiode 811, the charge will first pass through the portion 821 of the channel 822 and fill into the potential well 896 of the floating diffusion 813 up to a certain level 899 that is the reset level of the potential well 897 of the portion 821 of the channel 822, and then after reaching that level additional charge will fill into both the potential well 896 of the floating diffusion 813 and the potential well 897 of the portion 821 of the channel 822. This allows for the capacitance of the readout node 848 that includes the floating diffusion 813 and the portion 821 of the channel 822 to jump to a higher value once a certain amount of charge has been accumulated.

In various embodiments, the readout node 848 is configured to have a lower capacitance when reset to a reset voltage by the reset transistor 814 than when filled with charge from the photodiode 811. In various embodiments, the readout node 848 is configured such that the capacitance of the readout node 848 is a first capacitance when the readout node 848 is reset and such that the capacitance of the readout node 848 jumps from the first capacitance to a second capacitance that is higher than the first capacitance after the readout node 848 has been filled with a certain amount of charge. Also, in various embodiments, the readout node 848 is configured to have a first level of capacitance after being reset and to have a second level of capacitance after receiving a certain amount of charge.

In various embodiments, the portion 821 of the channel 822 under the transfer gate 812 is located adjacent to the floating diffusion 813 and is configured to provide the potential well 897 with a different level than a level of the potential well 896 of the floating diffusion 813 when the floating diffusion 813 is reset. In various embodiments, the floating diffusion 813 and the portion 821 of the channel 822 are configured to provide potential wells of different levels when the readout node 848 is reset, such as the potential wells 896 and 897.

Figure 17:
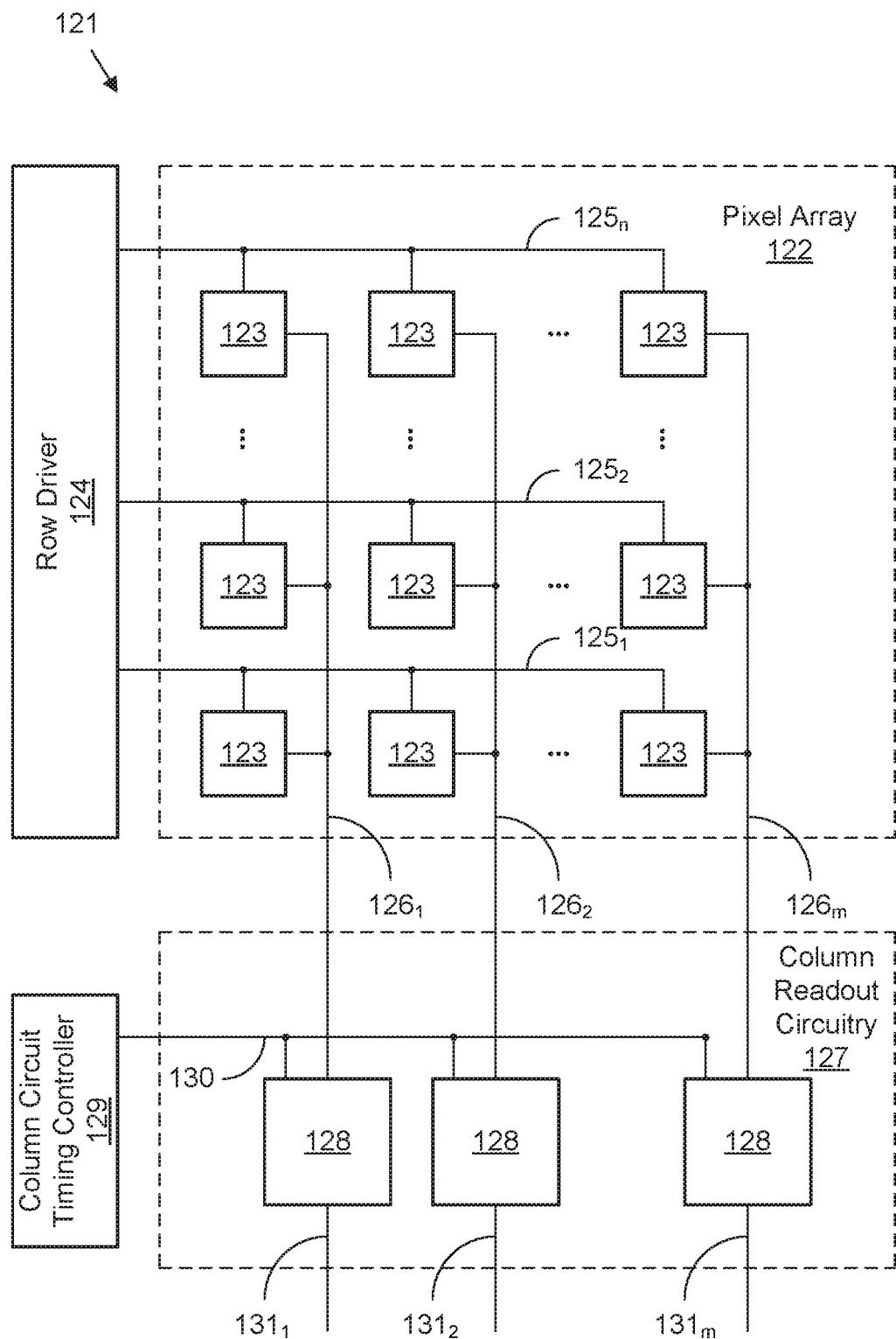
FIG. 17 shows an image sensor in accordance with an embodiment.

FIG. 17 shows an image sensor 121 in accordance with an embodiment. The image sensor 121 includes a pixel array 122, a row driver 124, column readout circuitry 127, and a column circuit timing controller 129. The pixel array 122 includes pixels 123 that are arranged in rows and columns. Each pixel 123 includes a photodiode and a readout node for receiving charge transferred from the photodiode and that is configured to have a variable capacitance that is non-linear with respect to a voltage at the readout node. In some embodiments, each pixel 123 has a structure of the pixel 50 of FIG. 5. In some embodiments, each pixel 123 has a structure of the pixel 60 of FIG. 6. In some embodiments, each pixel 123 has a structure of the pixel 80 of FIG. 8. In some embodiments, each pixel 123 has a structure of the pixel 100 of FIG. 10. In some embodiments, each pixel 123 has a structure of the pixel 110 of FIG. 11A. In some embodiments, each pixel 123 has a structure of the pixel 410 of FIG. 12A. In some embodiments, each pixel 123 has a structure of the pixel 510 of FIG. 13A. In some embodiments, each pixel 123 has a structure of the pixel 610 of FIG. 14A. In some embodiments, each pixel 123 has a structure of the pixel 710 of FIG. 15A. In some embodiments, each pixel 123 has a structure of the pixel 810 of FIG. 16A. With reference to FIG. 17, the row driver 124 supplies control signals to the pixels 123 in the pixel array 122 to control operations of the pixels 123.

Pixels 123 that are in a same row of the pixel array 122 share common row control signals from the row driver 124. For example, pixels 123 in a first row of the pixel array 122 share common row control lines $125_1$ for receiving control signals from the row driver 124. Similarly, pixels 123 in a second row of the pixel array 122 share common row control lines $125_2$ for receiving control signals from the row driver 124, and pixels 123 in an $n^{th}$ row of the pixel array 122 share common row control lines $125_n$ for receiving control signals from the row driver 124. Pixels 123 that are in a same column of the pixel array 122 share a common column readout line to provide output. For example, pixels 123 in a first column of the pixel array 122 share a column readout line $126_1$, pixels 123 in a second column of the pixel array 122 share a column readout line $126_2$, and pixels 123 in an $m^{th}$ column of the pixel array 122 share a column readout line $126_m$. In various embodiments, the row driver 124 controls the pixels 123 to provide output row by row.

The column readout circuitry 127 includes a column readout circuit 128 for each column of pixels 123 in the pixel array 122. Each column readout circuit 128 is connected to receive analog signals from a corresponding column readout line, and is configured to provide digital output on a corresponding output line. For example, the column readout circuit 128 for the first column is connected to the column readout line $126_1$ for receiving input, and is connected to an output line $131_1$ for providing output. Similarly, the column readout circuit 128 for the second column is connected to the column readout line $126_2$ for receiving input, and is connected to an output line $131_2$ for providing output, and the column readout circuit 128 for the $m^{th}$ column is connected to the column readout line $126_m$ for receiving input, and is connected to an output line $131_m$ for providing output. The column circuit timing controller 129 is configured to provide control signals to the plurality of column readout circuits 128 over one or more control lines 130.

Figure 18:
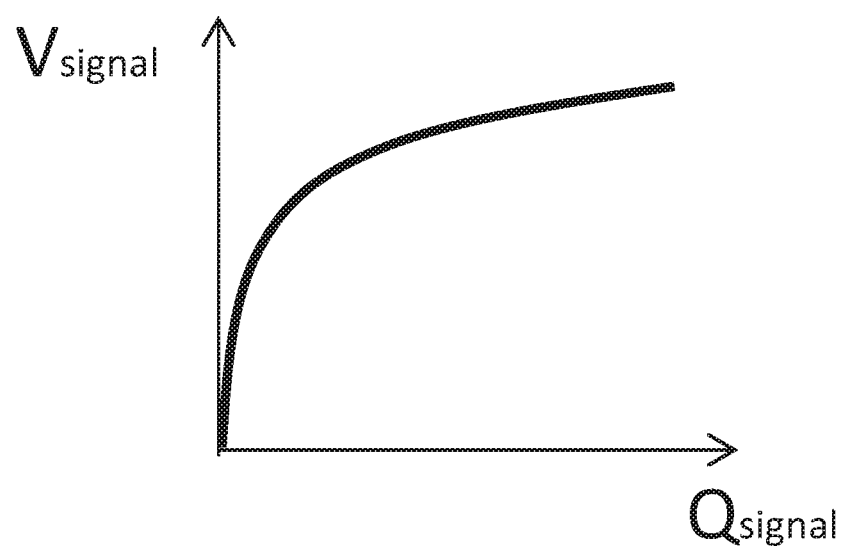
FIG. 18 shows an example of a dependence of a pixel output signal voltage versus the signal charge and illustrates a non-linear response and high small signal gain for a variable capacitance readout.

FIG. 18 shows an example of a dependence of a pixel output signal voltage ($V_{signal}$) versus signal charge ($Q_{signal}$) and illustrates a non-linear response and high small signal gain for a variable capacitance readout. With reference to FIGS. 17 and 18, in various embodiments, the resulting response of each pixel 123 is non-linear, and each column readout circuit 128 is calibrated to properly read signal values and apply correction if needed.

In various embodiments, a variable capacitance readout node is formed in a pixel having a p-n junction as an in-pixel sensitive readout node. In various embodiments, a variable capacitance readout node is formed in a pixel having an n-p junction as an in-pixel sensitive readout node. In various embodiments, a variable capacitance readout node is formed in a pixel having an $n^+/p$ junction as an in-pixel sensitive readout node. In various embodiments, a variable capacitance readout node is formed in a pixel having a $p^+/n$ junction as an in-pixel sensitive readout node.

While various 4 transistor (4T) pixels and 5 transistor (5T) pixels have been illustrated in various embodiments, it should be understood that the techniques disclosed herein for forming variable capacitance readout nodes can equally be applied to three transistor (3T) pixels, etc. Also, while various pixels have been illustrated in various embodiments with individual readout circuitry for each pixel, it should be understood that in various embodiments there may be, for example, pixels with 2-way or 4-way shared readouts among pixels, such that adjacent pixels share readout circuitry.

Various embodiments provide a global shutter pixel with floating diffusion readout. Also, in various embodiments, pixels located diagonal to each other in a pixel array may share various structures with each other. In various embodiments, a variable readout capacitance at a readout node is small when the readout node is reset, and the variable readout capacitance turns into a larger capacitance upon filling of a potential well of the readout node with signal electrons or holes. In some embodiments, an image sensor has multiple column readout lines for each column of pixels and reads out pixel signals to both a top side and a bottom side of the image sensor from multiple rows of pixels at a time.

Figure 19:
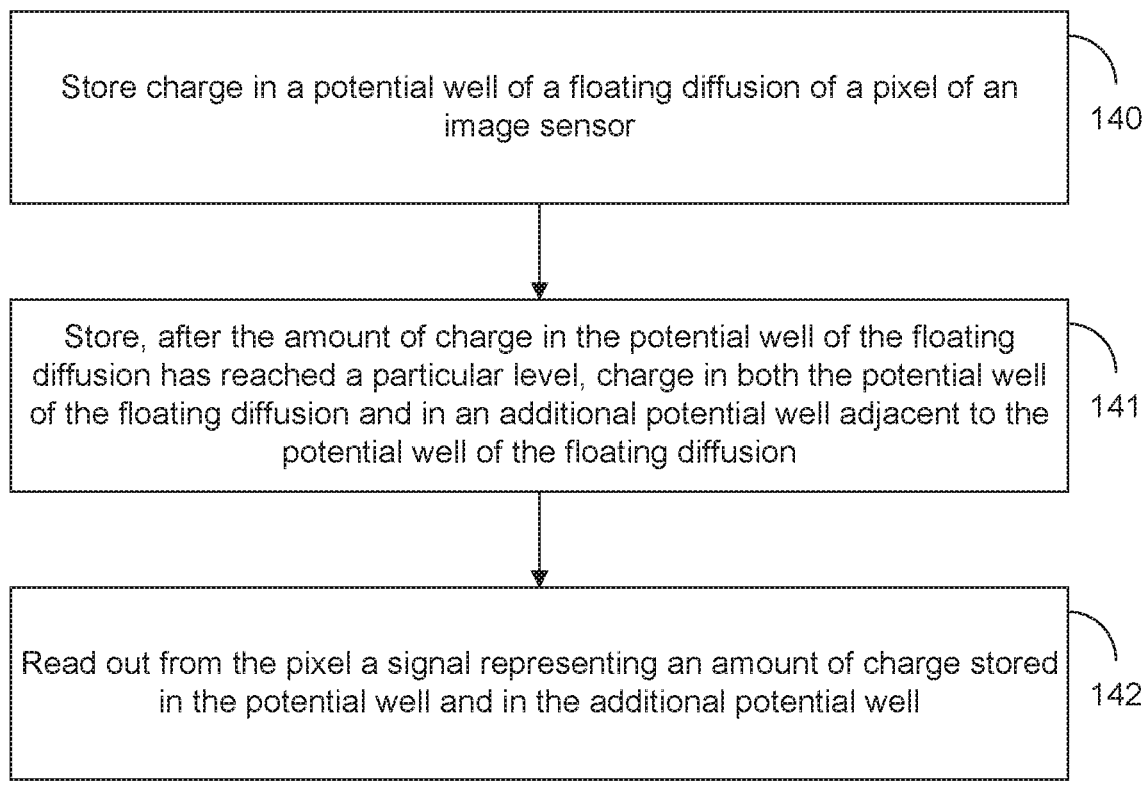
FIG. 19 shows a flowchart of a method in accordance with an embodiment.

FIG. 19 shows a flowchart of a method for a pixel of an image sensor in accordance with an embodiment. In step 140, charge is stored in a potential well of a floating diffusion of the pixel of the image sensor. In step 141, after the amount of charge in the potential well of the floating diffusion has reached a particular level, charge is stored in both the potential well of the floating diffusion and in an additional potential well adjacent to the potential well of the floating diffusion. In step 142, a signal is read out from the pixel representing an amount of charge stored in the potential well and in the additional potential well. In various embodiments, the additional potential well adjacent to the potential well of the floating diffusion is provided by a portion of a barrier region that includes a portion of a barrier layer and a barrier channel. For example, with reference to FIGS. 11A and 11B, the second portion 47 of the barrier region 45 that includes the portion of the p$^+$ barrier layer and the n$^-$ barrier channel provides the potential well 97 that is an additional potential well adjacent to the potential well 96 of the floating diffusion 113.

The embodiments disclosed herein are to be considered in all respects as illustrative, and not restrictive of the invention. The present invention is in no way limited to the embodiments described above. Various modifications and changes may be made to the embodiments without departing from the spirit and scope of the invention. For example, although some of the above embodiments have been described with reference to the formation of n type implants in a p type substrate, various other embodiments may equally use p type implants in an n type substrate. Various modifications and changes that come within the meaning and range of equivalency of the claims are intended to be within the scope of the invention.

What is claimed is:

1. A pixel, comprising:
a photodiode; and
a readout node for receiving charge transferred from the photodiode by a transfer gate;
wherein the readout node is configured to have a variable capacitance that is non-linear with respect to a voltage at the readout node;
wherein the readout node includes a floating diffusion in a substrate and a portion of a channel under the transfer gate that provide for the variable capacitance; and
wherein the readout node is configured such that the variable capacitance is usable to hold the charge while a signal representing an amount of the charge in the readout node is read from the pixel.

2. The pixel of claim 1,
wherein the readout node is resettable; and
wherein the readout node is configured to have a lower capacitance when reset to a reset voltage than after having been filled with a certain amount of charge from the photodiode.

3. The pixel of claim 1,
wherein the readout node is configured such that the capacitance of the readout node is a first capacitance when the readout node is reset and such that the capacitance of the readout node jumps from the first capacitance to a second capacitance that is higher than the first capacitance after the readout node has been filled with a certain amount of charge.

4. The pixel of claim 1,
wherein the readout node is configured to have a first level of capacitance after being reset and to have a second level of capacitance after receiving a certain amount of charge.

5. The pixel of claim 1,
wherein the portion of the channel under the transfer gate includes n$^-$ area that is formed from an n type dopant.

6. The pixel of claim 1, further comprising:
a p$^+$ barrier located under a portion of the transfer gate.

7. The pixel of claim 6, further comprising:
wherein the transfer gate does not have any threshold adjust implant.

8. The pixel of claim 6,
wherein the transfer gate includes a threshold adjust implant.

9. An image sensor, comprising:
a pixel array comprising a plurality of pixels arranged in rows and columns;
wherein each pixel of the plurality of pixels comprises:
a photodiode; and
a readout node for receiving charge transferred from the photodiode by a transfer gate and that is configured to have a variable capacitance that is non-linear with respect to a voltage at the readout node, the readout node including a floating diffusion in a substrate and a portion of a channel under the transfer gate that provide for the variable capacitance, wherein the readout node is configured such that the variable capacitance is usable to hold the charge while a signal representing an amount of the charge in the readout node is read from the pixel.

10. The pixel of claim 1,
wherein the pixel is configured such that the charge is storable in the floating diffusion and in the portion of the channel under the transfer gate while the signal representing the amount of charge in the readout node is output from the pixel.

11. The pixel of claim 1,
wherein the readout node is configured to have a low capacitance and high conversion gain for small charges stored at the readout node relative to a higher capacitance and lower conversion gain for larger charges stored at the readout node.

12. The pixel of claim 1, further comprising:
a barrier implant in a second portion of the channel under the transfer gate.

13. The pixel of claim 12,
wherein the portion of the channel under the transfer gate is located between the barrier implant and the floating diffusion.

14. The pixel of claim 12,
wherein the barrier implant is a p$^+$ type implant.

15. The pixel of claim 1,
wherein the portion of the channel under the transfer gate is located between the photodiode and the floating diffusion.

16. The pixel of claim 1,
wherein the channel under the transfer gate includes BF2 as a threshold adjust implant.

17. The pixel of claim 1,
wherein the portion of the channel under the transfer gate includes an NMOS threshold adjust implant.

18. The pixel of claim 1,
wherein the transfer gate is controllable by a transfer control signal to transfer the charge from the photodiode to the readout node.

19. The pixel of claim 18, further comprising:
a barrier implant that is configured to prevent the charge from spilling back into the photodiode when the charge is being transferred to the readout node.

20. The pixel of claim 19,
wherein the portion of the channel under the transfer gate is located between the barrier implant and the floating diffusion.

* * * * *